US011864382B2

(12) United States Patent
Kim et al.

(10) Patent No.: US 11,864,382 B2
(45) Date of Patent: Jan. 2, 2024

(54) THREE-DIMENSIONAL SEMICONDUCTOR MEMORY DEVICE WITH VERTICAL CHANNELS IN A CONNECTION REGION HAVING A LOWER CHANNEL PATTERN CONTACTING THE SUBSTRATE

(71) Applicant: SAMSUNG ELECTRONICS CO., LTD., Suwon-si (KR)

(72) Inventors: Jongwon Kim, Hwaseong-si (KR); Young-Jin Jung, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 33 days.

(21) Appl. No.: 17/073,786

(22) Filed: Oct. 19, 2020

(65) Prior Publication Data

US 2021/0074724 A1   Mar. 11, 2021

Related U.S. Application Data

(63) Continuation of application No. 15/991,476, filed on May 29, 2018, now Pat. No. 10,818,687.

(30) Foreign Application Priority Data

Jul. 25, 2017 (KR) .......................... 10-2017-0094401

(51) Int. Cl.
*H10B 43/27* (2023.01)
*H10B 41/27* (2023.01)
(Continued)

(52) U.S. Cl.
CPC ......... *H10B 43/27* (2023.02); *H01L 29/7926* (2013.01); *H10B 41/27* (2023.02);
(Continued)

(58) Field of Classification Search
CPC ......... H01L 27/11556; H01L 27/11582; H01L 27/11521–11524;
(Continued)

(56) References Cited

U.S. PATENT DOCUMENTS 9,123,748 B2    9/2015  Aritome
9,362,306 B2    6/2016  Park et al.
(Continued)

FOREIGN PATENT DOCUMENTS

CN    103383943    11/2013
CN    105845687     8/2016
(Continued)

*Primary Examiner* — Younes Boulghassoul
(74) *Attorney, Agent, or Firm* — F. CHAU & ASSOCIATES, LLC

(57) ABSTRACT

A three-dimensional semiconductor memory device and a method of manufacturing the same. The device may include a substrate including a cell array region and a connection region, an electrode structure including electrodes vertically stacked on the substrate, a plurality of first vertical structures penetrating the electrode structures on the cell array region, and a plurality of second vertical structures penetrating the electrode structures on the connection region. Each of the first and second vertical structures may include a lower semiconductor pattern connected to the substrate and an upper semiconductor pattern connected to the lower semiconductor pattern.

20 Claims, 25 Drawing Sheets

(51) Int. Cl.
*H10B 41/40* (2023.01)
*H10B 41/50* (2023.01)
*H10B 43/50* (2023.01)
*H10B 43/40* (2023.01)
*H01L 29/792* (2006.01)

(52) U.S. Cl.
CPC ............ *H10B 41/40* (2023.02); *H10B 41/50* (2023.02); *H10B 43/50* (2023.02); *H10B 43/40* (2023.02)

(58) Field of Classification Search
CPC ........ H01L 27/11526–11546; H01L 27/11548; H01L 27/11551; H01L 27/11519; H01L 27/11568–1157; H01L 27/11573; H01L 27/11575; H01L 27/11578; H01L 27/11565; H10B 41/27; H10B 43/27; H10B 41/35; H10B 41/40–41; H10B 41/50; H10B 43/35; H10B 43/40; H10B 43/50
See application file for complete search history.

(56) References Cited

U.S. PATENT DOCUMENTS

| | | |
|---|---|---|
| 9,379,134 B2 | 6/2016 | Lee et al. |
| 9,478,561 B2 | 10/2016 | Kim et al. |
| 9,536,897 B2 | 1/2017 | Yoo et al. |
| 9,576,967 B1 * | 2/2017 | Kimura ............ H01L 27/11582 |
| 9,601,577 B1 | 3/2017 | Lee et al. |
| 9,646,975 B2 | 5/2017 | Peri et al. |
| 9,716,104 B2 | 7/2017 | Kim et al. |
| 9,893,082 B2 | 2/2018 | Kim et al. |
| 9,893,083 B1 | 2/2018 | Kim et al. |
| 9,911,745 B2 | 3/2018 | Lee et al. |
| 9,917,101 B1 | 3/2018 | Konagai |
| 9,972,636 B2 | 5/2018 | Kim et al. |
| 10,026,749 B2 | 7/2018 | Park et al. |
| 10,096,616 B2 | 10/2018 | Lee et al. |
| 10,153,292 B2 | 12/2018 | Kim et al. |
| 10,276,591 B2 | 4/2019 | Lee et al. |
| 2015/0060977 A1 | 3/2015 | Lee et al. |
| 2015/0340376 A1 | 11/2015 | Park et al. |
| 2016/0048423 A1 | 2/2016 | Yoo et al. |
| 2016/0111441 A1 | 4/2016 | Park et al. |
| 2016/0225785 A1 | 8/2016 | Kim et al. |
| 2016/0268287 A1 | 9/2016 | Park et al. |
| 2017/0040337 A1 | 2/2017 | Kim et al. |
| 2017/0062454 A1 | 3/2017 | Lu et al. |
| 2017/0084618 A1 | 3/2017 | Peri et al. |
| 2017/0117288 A1 | 4/2017 | Maegawa et al. |
| 2017/0146811 A1 | 5/2017 | Zhang et al. |
| 2017/0358590 A1 | 12/2017 | Kang et al. |
| 2017/0365613 A1 * | 12/2017 | Gunji-Yoneoka ........................... H01L 27/1157 |
| 2018/0053768 A1 | 2/2018 | Kim et al. |
| 2018/0108671 A1 | 4/2018 | Yu et al. |
| 2018/0122819 A1 | 5/2018 | Shim et al. |
| 2018/0130812 A1 | 5/2018 | Hosoda et al. |
| 2018/0138195 A1 | 5/2018 | Lee |
| 2018/0350831 A1 | 12/2018 | Kim et al. |
| 2019/0035807 A1 | 1/2019 | Kim et al. |
| 2019/0333923 A1 | 10/2019 | Kim et al. |
| 2019/0371808 A1 | 12/2019 | Choi et al. |

FOREIGN PATENT DOCUMENTS

| | | |
|---|---|---|
| CN | 103449648 | 2/2017 |
| CN | 106558591 | 4/2017 |
| CN | 1066011752 | 4/2017 |
| CN | 106952926 | 7/2017 |
| JP | 2005-091741 | 4/2005 |
| JP | 2005-303109 | 10/2005 |
| KR | 10-2016-0020019 | 2/2016 |
| KR | 1020160094827 | 8/2016 |
| KR | 10-2017-0018207 | 2/2017 |
| KR | 1020170042452 | 4/2017 |

* cited by examiner

THREE-DIMENSIONAL SEMICONDUCTOR MEMORY DEVICE WITH VERTICAL CHANNELS IN A CONNECTION REGION HAVING A LOWER CHANNEL PATTERN CONTACTING THE SUBSTRATE

CROSS-REFERENCE TO RELATED APPLICATIONS

This U.S. non-provisional patent application is a Continuation of co-pending U.S. patent application Ser. No. 15/991,476, filed on May 29, 2018, which claims priority under 35 U.S.C. § 119 to Korean Patent Application No. 10-2017-0094401, tiled on Jul. 25, 2017, in the Korean intellectual Property Office, the entire contents of which are incorporated by reference herein.

TECHNICAL FIELD

The inventive concept relates to a three-dimensional semiconductor memory device, and in particular, to a three-dimensional semiconductor memory device with high reliability and a high integration density.

DISCUSSION OF THE RELATED ART

Higher integration of semiconductor devices may lead to satisfying consumer demands for superior performance of electronic devices having relatively inexpensive prices. In the case of semiconductor devices, higher integration is an important factor in determining product prices, thus such advancements are desirable. In the case of conventional two-dimensional or planar semiconductor devices, their integration is mainly determined by the area occupied by a unit memory cell, and integration is greatly influenced by the level of a fine pattern forming technology. However, the extremely expensive process equipment needed to increase pattern fineness sets a practical limitation on increasing integration for two-dimensional or planar semiconductor devices. To overcome such a limitation, there have been recently proposed three-dimensional semiconductor memory devices including three-dimensionally arranged memory cells.

SUMMARY

Some embodiments of the inventive concept provide a three-dimensional semiconductor memory device having higher reliability and a higher integration density than known heretofore.

According to some embodiments of the inventive concept, a three-dimensional semiconductor memory device may include a substrate including a cell array region and a connection region, one or more electrode structures including electrodes vertically stacked on the substrate, a plurality of first vertical structures penetrating the electrode structures on the cell array region, and a plurality of second vertical structures penetrating the electrode structures on the connection region. Each of the first and second vertical structures may include a lower semiconductor pattern connected to the substrate and an upper semiconductor pattern connected to the lower semiconductor pattern. Top surfaces of the lower semiconductor patterns of the first vertical structures may be positioned higher than a top surface of the lowermost one of the electrodes, and top surfaces of the lower semiconductor patterns of the second vertical structures may be positioned lower than a bottom surface of the lowermost one of the electrodes.

According to some embodiments of the inventive concept, a three-dimensional semiconductor memory device may include a substrate including a cell array region and a connection region, an electrode structure including a plurality of electrodes, which are stacked in a first direction perpendicular to a top surface of the substrate, the electrode structure having a staircase structure on the connection region, a first vertical structure provided (e.g., arranged, positioned) to penetrate the electrode structure OD the cell array region, the first vertical structure including a first lower semiconductor pattern in contact with the substrate and a first upper semiconductor pattern connected to the first lower semiconductor pattern, and a second vertical structure provided to penetrate the electrode structure on the connection region, the second vertical structure including a second lower semiconductor pattern in contact with the substrate and a second upper semiconductor pattern connected to the second lower semiconductor pattern. The second vertical structure may have a bottom surface positioned at a level lower than a bottom surface of the first vertical structure.

According to some embodiments of the inventive concept, a three-dimensional semiconductor memory device may include a substrate including a cell array region and a connection region, a dummy insulating layer provided in the connection region of the substrate, an electrode structure provided on the cell array region of the substrate, and extended onto the dummy insulating pattern of the connection region, the electrode structure including electrodes vertically stacked on the substrate, a first vertical structure provided to penetrate the electrode structure on the cell array region and to be in contact with the substrate, and a second vertical structure provided to penetrate the electrode structure and the dummy insulating pattern on the connection region and to be in contact with the substrate.

According to some embodiments of the inventive concept, a method of manufacturing a three-dimensional semiconductor memory device includes providing a substrate including an epitaxial layer formed by a selective epitaxial growth (SEG) process, the substrate including a cell array region and a connection region; vertically stacking a plurality of electrode structures including gate electrodes on the substrate in respective stacks on the cell array region and the connection region, and a plurality of channel holes and dummy holes to penetrate the respective stacks of gate electrodes; arranging a plurality of first vertical structures to penetrate the electrode structures on the cell array region, and arranging a plurality of second vertical structures to penetrate the electrode structures on the connection region, wherein each of the first and second vertical structures comprises a lower semiconductor pattern connected to the substrate and an upper semiconductor pattern connected to the lower semiconductor pattern; positioning top surfaces of the lower semiconductor patterns of the plurality of first vertical structures at a level higher than a top surface of the lowermost one of the electrodes, and positioning top surfaces of the lower semiconductor patterns of the plurality of second vertical structures at a level lower than a bottom surface of the lowermost one of the electrodes.

In some embodiments of the inventive concept, the method of manufacturing a three-dimensional semiconductor memory device may further include forming a device isolation layer below the dummy holes.

The three-dimensional semiconductor memory device manufactured according to the method may comprise a vertical-type NAND FLASH.

In some embodiments of the method of manufacturing a three-dimensional semiconductor memory device, at least some of the electrodes of the plurality of electrode structures are configured as control gate electrodes of memory cell transistors provided in the cell array region of the substrate.

BRIEF DESCRIPTION OF THE DRAWINGS

Example embodiments of the inventive concept will be more clearly understood by a person of ordinary skill in the art from the following brief description taken in conjunction with the accompanying drawings. The accompanying drawings represent non-limiting, example embodiments as described herein.

FIGS. 3A and 3B are plan views illustrating a three-dimensional semiconductor memory device according to some embodiments of the inventive concept, in which FIG. 3A shows an adjacent pair of the second vertical structures in a second direction being provided to penetrate a corresponding one of the dummy insulating patterns, and FIG. 3B shows each of the second vertical structures VS2 being provided to penetrate a corresponding one of the dummy insulating patterns 12D.

FIGS. 14, 15, 16, 17, 18 and 19 are sectional views which are taken along line A-A' of FIGS. 3A and 3B to illustrate a method of fabricating a three-dimensional semiconductor memory device, according to some embodiments of the inventive concept in which: FIG. 14 shows a plurality of the dummy insulating patterns 12D may be formed in the connection region CNR of the substrate, FIG. 15 shows after the formation of the mold structure, a planarized insulating layer may be formed on the substrate, FIG. 16 shows the first and second lower semiconductor patterns may be formed to fill lower regions of the first and second vertical holes, FIG. 17 shows the first and second vertical insulating patterns VP1 and VP2 may be formed in the first and second vertical holes VH and DH, before the formation of the first and second upper semiconductor patterns, FIG. 18 shows the first interlayered insulating layer may be formed on the planarized insulating layer to cover the top surfaces of the first and second vertical structures, and FIG. 19 shows a gate insulating layer may be formed on the side surfaces of the first lower semiconductor patterns LSP1 exposed by the lowermost ones of the gate regions GR.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Some example embodiments of the inventive concept will now be described more fully with reference to the accompanying drawings.

Figure 1:
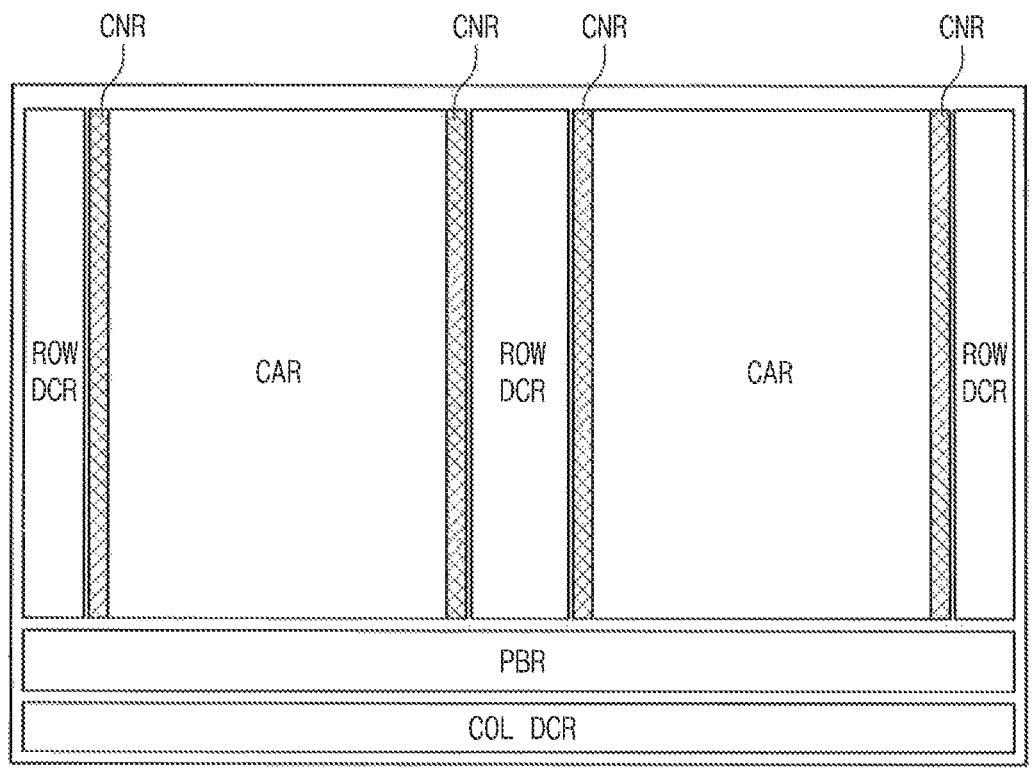
FIG. 1 is a plan view illustrating a schematic configuration of a three-dimensional semiconductor memory device according to some embodiments of the inventive concept.

FIG. 1 is a plan view illustrating a schematic configuration of a three-dimensional semiconductor memory device according to some embodiments of the inventive concept.

Referring now to FIG. 1, a three-dimensional semiconductor memory device may include a cell array region CAR and a peripheral circuit region PCR. The peripheral circuit region may include row decoder regions ROW DCR, a page buffer region PBR, a column decoder region COL DCR, and a control circuit region (not shown). In some embodiments of the inventive concept, a connection region CNR may be provided between the cell array region CAR and each of the row decoder regions ROW DCR.

A memory cell array including a plurality of memory cells may be provided in the array region CAR. In some embodiments of the inventive concept, the memory cell array may include a plurality of memory blocks, each memory block being configured to independently perform an erase operation. Each of the memory blocks may include a plurality of memory cells, which are three-dimensionally arranged in the memory cell array, and a plurality of word and bit lines, which are electrically connected to the memory cells.

In each of the row decoder regions ROW DCR, a row decoder may be provided that is configured to select at least one of the word lines that are provided in the memory cell array, and in the connection region CNR, an interconnection structure may be provided to electrically connect the memory cell array to the row decoder. The row decoder may be configured to select at least one of the word lines, based on address information. The row decoder may be configured to apply different word line voltages to selected and unselected ones, respectively, of the word lines, in response to control signals from a control circuit (not shown).

In the page buffer region PBR, a page buffer may be provided to read out data stored in the memory cells. Depending on an operating mode, the page buffer may be configured to temporarily store data in the memory cells or to read out data stored in the memory cells. For example, the page buffer may temporarily stored data that is to be stored in the memory cell arrays, or server to temporarily store the data that is being read out of the memory cells (e.g., serving as a staging area for the data). In another example, the page buffer may function as a write driver in a program operation mode or as a sense amplifier in a read operation mode.

A column decoder may be provided in the column decoder region COL DCR and may be connected to the bit lines of the memory cell array. The column decoder may provide data-transmission paths between the page buffer and an external device (e.g., a memory controller).

Figure 2:
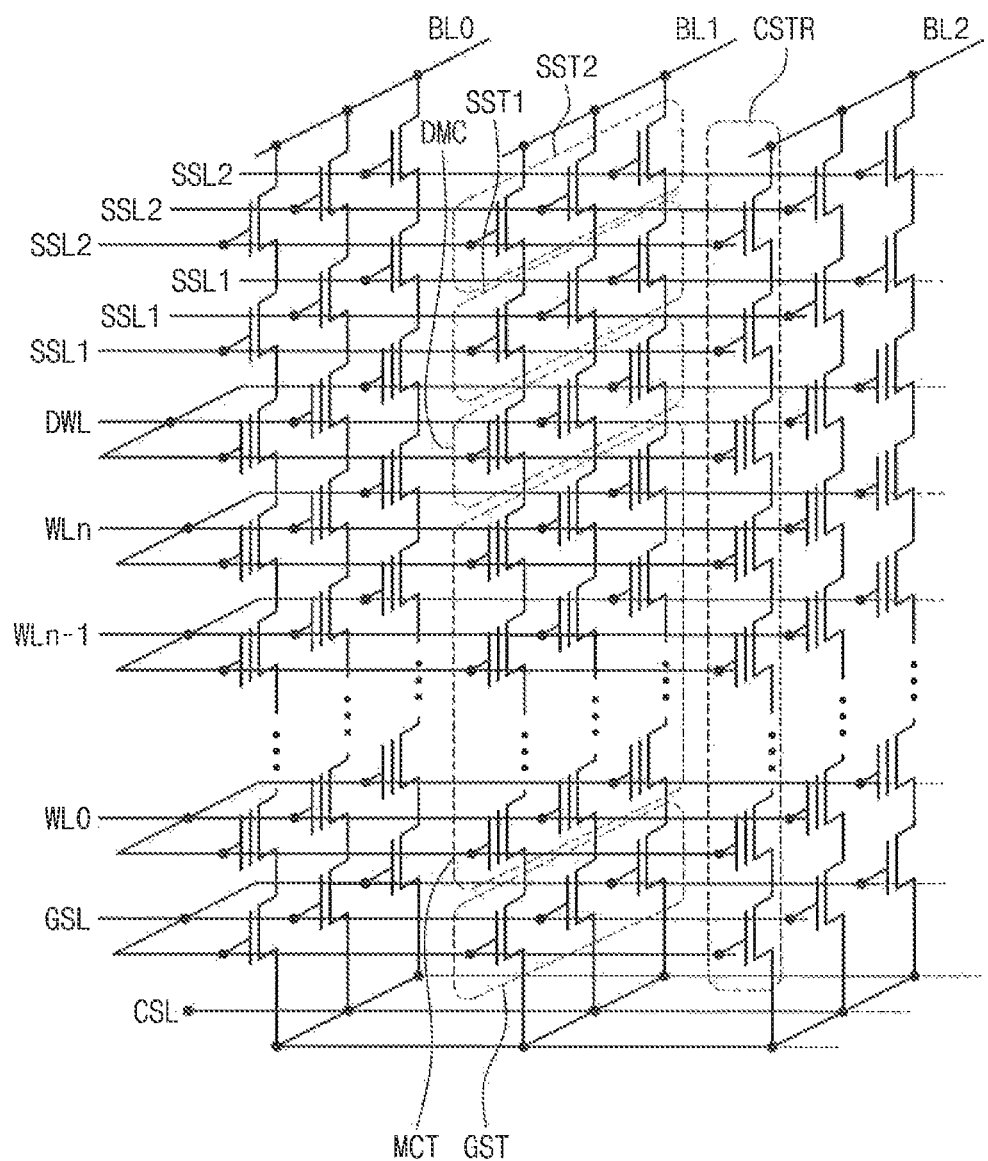
FIG. 2 is a circuit diagram of a memory cell array of a three-dimensional semiconductor memory device according to some embodiments of the inventive concept.

FIG. 2 is a circuit diagram of a memory cell array of a three-dimensional semiconductor memory device according to some embodiments of the inventive concept.

Referring now to FIG. 2, a three-dimensional semiconductor memory device according to some embodiments of the inventive concept may include a cell array, in which a common source line CSL, a plurality of bit lines BL0-BL2, and a plurality of cell strings CSTR therebetween are provided. An artisan should understand and appreciate that the inventive concept is not limited to the construction shown in FIG. 2.

The bit lines BL0-BL2 may be two-dimensionally arranged, and a plurality of cell strings CSTR may be connected in parallel to each of the bit lines BL0-BL2. The plurality of cell strings CSTR may be connected in common to the common source line CSL (FIG. 2). In other words, a plurality of cell strings CSTR may be provided between the bit lines BL0-BL2 and the common source line CSL. In some embodiments of the inventive concept, a plurality of common source lines CSL may be two-dimensionally arranged. The common source lines CSL may be applied with the same voltage or may be independently controlled.

In some embodiments of die inventive concept, each of the cell strings CSTR may include a plurality of string selection transistors SST1 and SST2, which are connected in series to each other, memory cell transistors MCT, which are connected in series to each other, and a ground selection transistor GST. Each of the memory cell transistors MCT may include a data storage element.

As an example, each of the cell strings CSTR may include first and second string selection transistors SST1 and SST2, the second string selection transistor SST2 may be coupled to the bit lines BL0-BL2, and the ground selection transistor GST may be coupled to the common source line CSL. The memory cell transistors MCT may be provided between the first string selection transistor SST1 and the ground selection transistor GST and may be connected in series to each other.

Furthermore, each of the cell strings CSTR may further include a dummy cell transistor DMC that may be provided between the first string selection transistor SST1 and the memory cell transistor MCT to connect them to each other. Although not shown in the drawings, the dummy cell transistor DMC may be provided between the ground selection transistor GST and the memory cell transistor MCT to connect them to each other.

As another example of the inventive concept, in each of the cell strings CSTR, the ground selection transistor GST may include a plurality of metal-oxide-semiconductor (MOS) transistors, which are connected in series to each other, similar to the string selection transistors SST1 and SST2. In addition, each of the cell strings CSTR may be configured to have a single string selection transistor.

With continued reference to FIG. 2, the first string selection transistor SST1 may be controlled by a first string selection line SSL1, and the second string selection transistor SST2 may be controlled by a second string selection line SSL2. The memory cell transistors MCT may be controlled by a plurality of word lines WL0-WLn, and the dummy cells may be controlled by a dummy word line DWL. The ground selection transistor GST may be controlled by a ground selection line GSL. The common source line CSL may be connected in common sources of the ground selection transistors GST.

Since each cell string CSTR includes the plurality of memory cell transistors MCT that are positioned at different heights from the common source lines CSL, the word lines WL0-WLn and DWL may have a multi-layered structure between the common source lines CSL and the bit lines BL0-BL2.

In addition, gate electrodes of the memory cell transistors MCT, which are disposed at the substantially same height from the common source lines CSL, may be connected in common to one of the word lines WL0-WLn and DWL, thereby being in an equipotential state. Alternatively, although the gate electrodes of the memory cell transistors MCT are disposed at the substantially same height from the common source lines CSL, some of them (e.g., disposed in a different row or column) may be independently controlled.

Figure 3A:
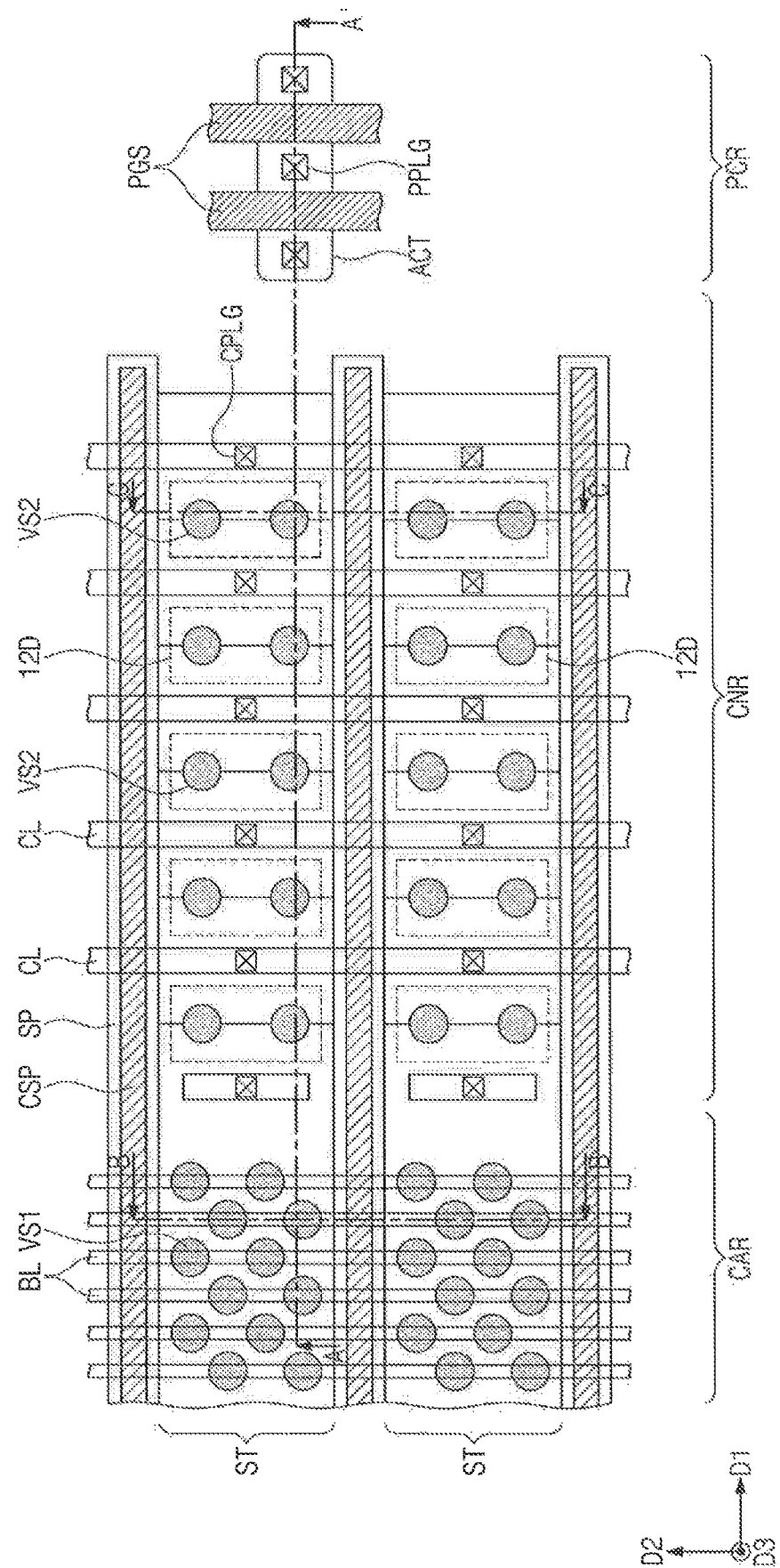
Figure 3B:
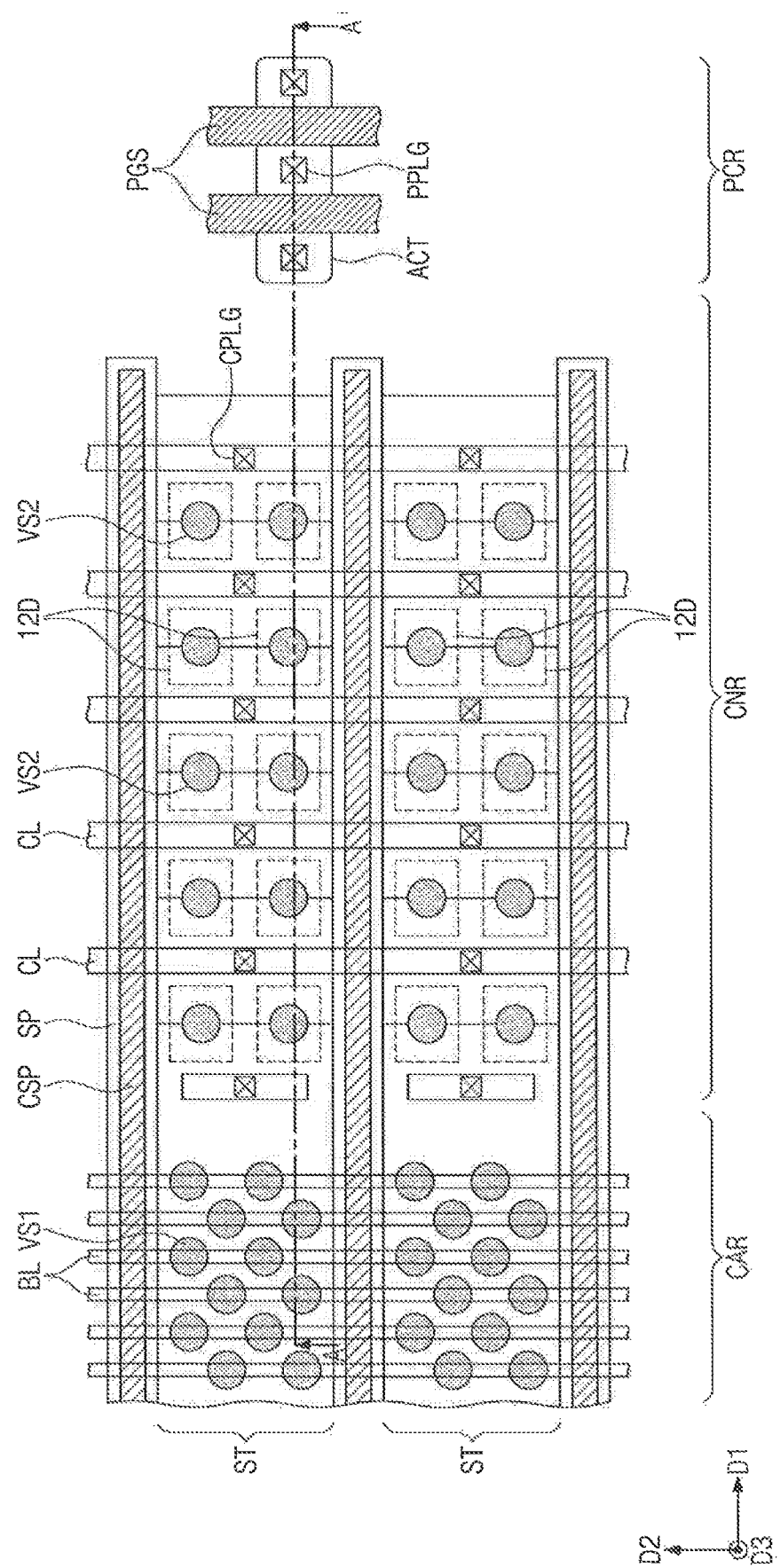
Figure 4A:
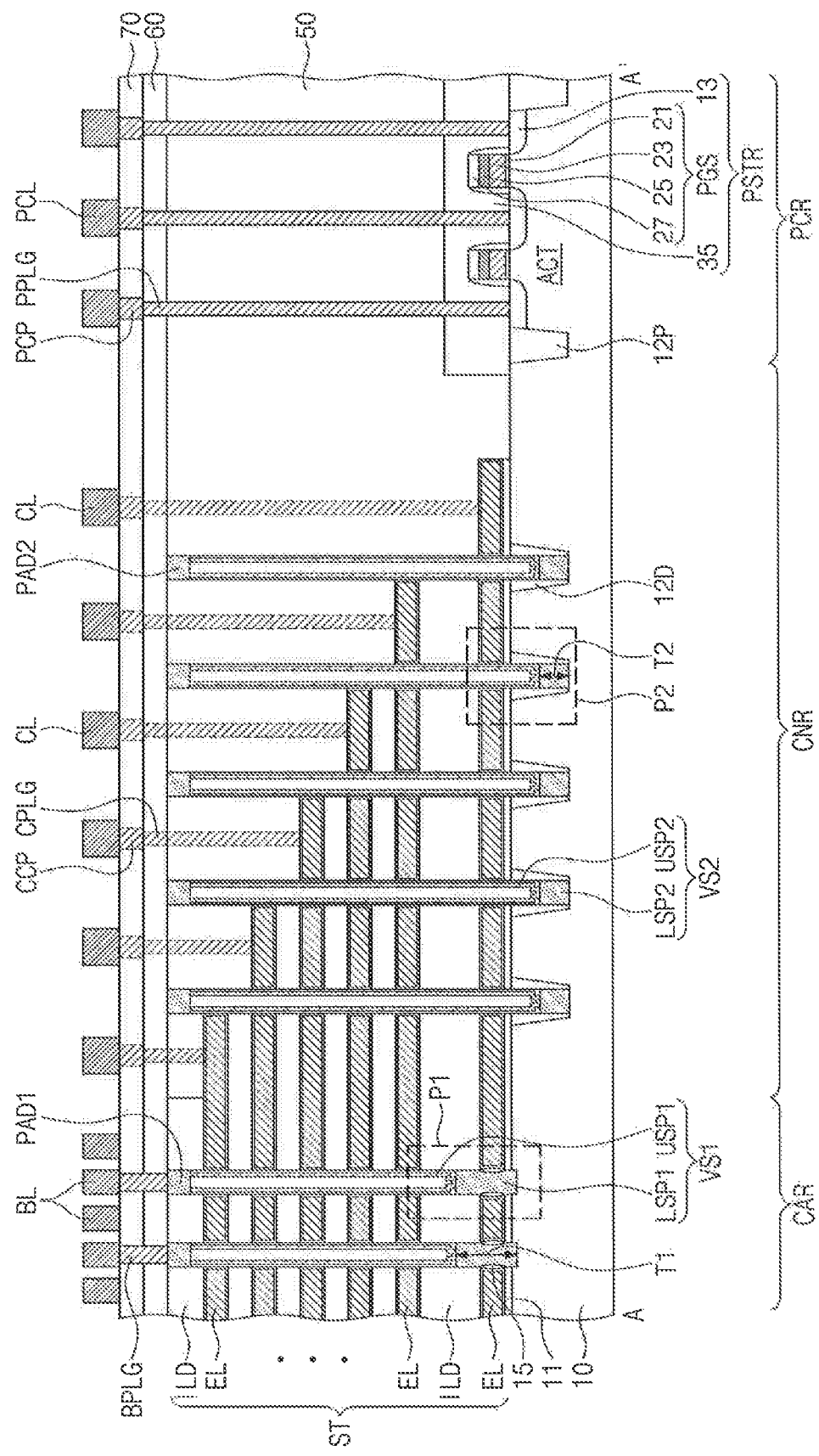
FIGS. 4A, 4B, and FIG. 4C are sectional views, which illustrate a three-dimensional semiconductor memory device according to some embodiments of the inventive concept and are taken along lines A-A', B-B', and C-C', respectively, of FIGS. 3A and 3B, and in which the FIG. 4A shows an upper surface of a third lower semiconductor pattern LSP3 may be higher than an upper surface of the lowermost one of the electrodes EL.
Figure 4B:
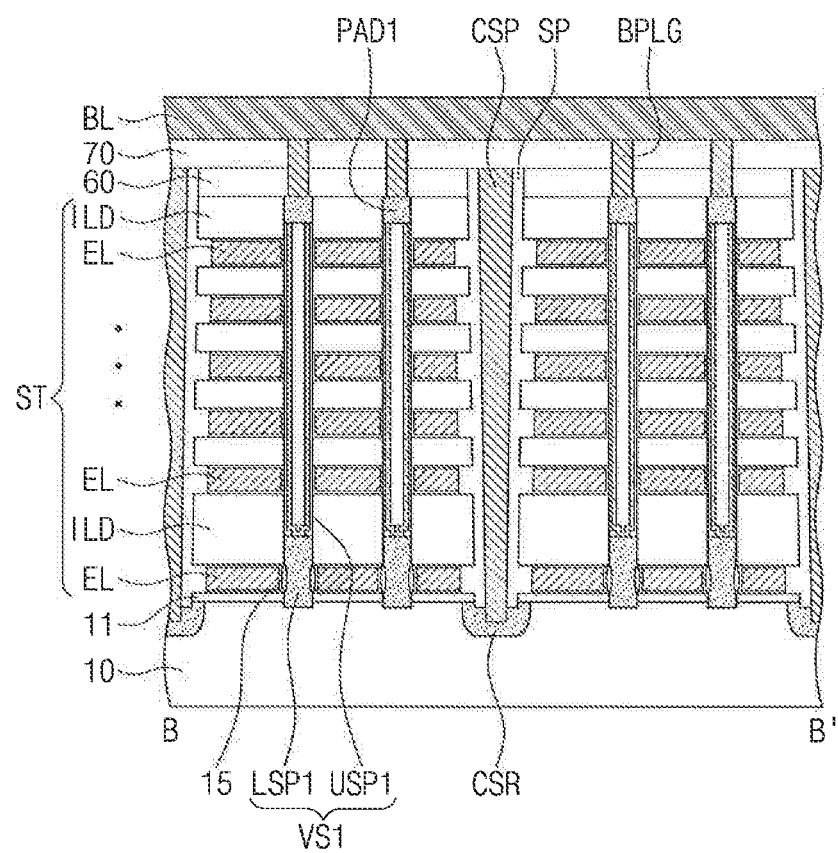
Figure 4C:
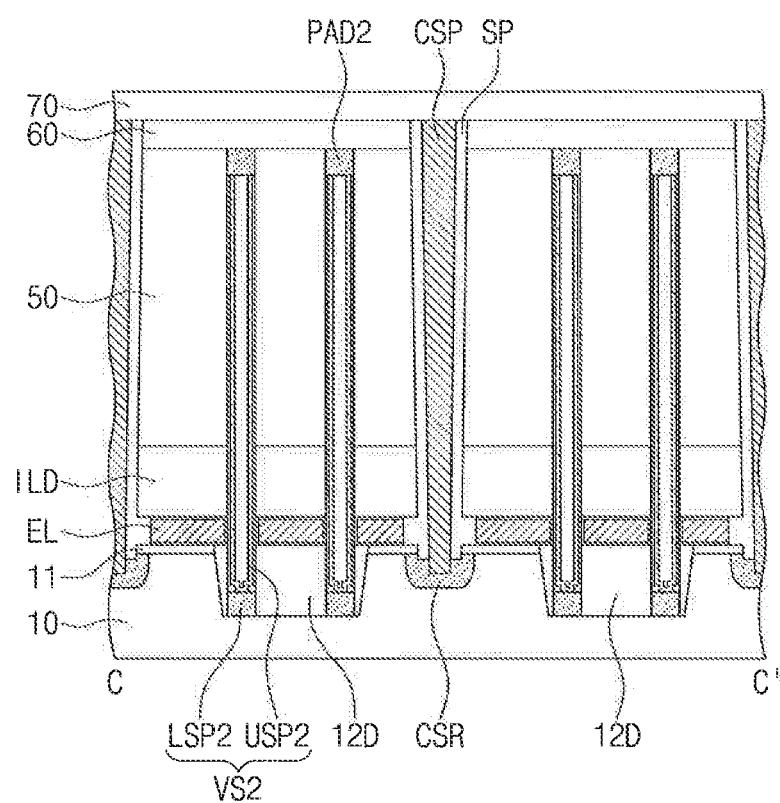
Figure 5A:
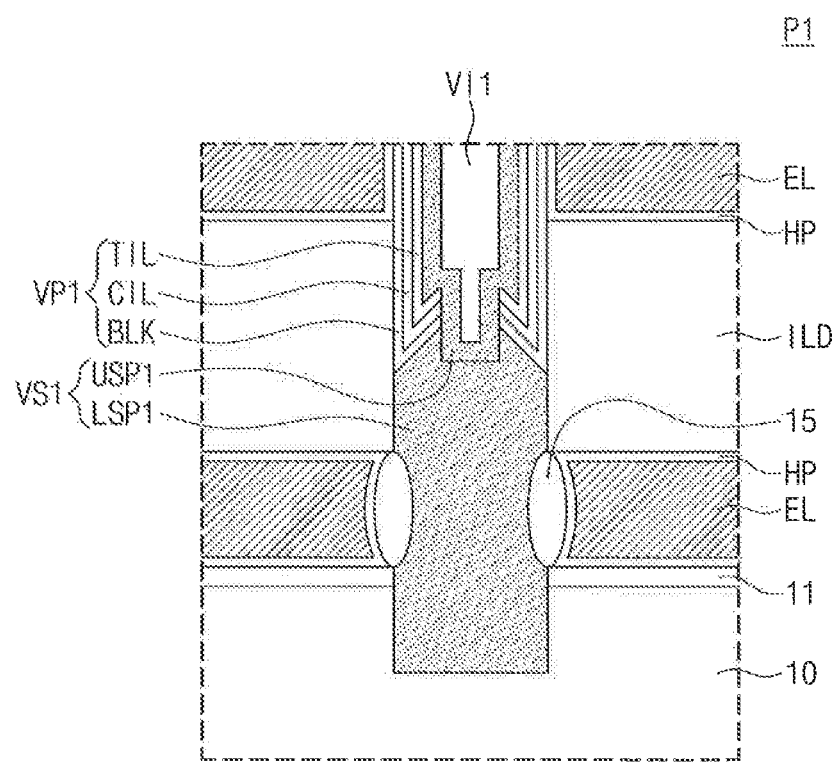
FIG. 5A is an enlarged sectional view of a portion 'P1' of FIG. 4A.
Figure 5B:
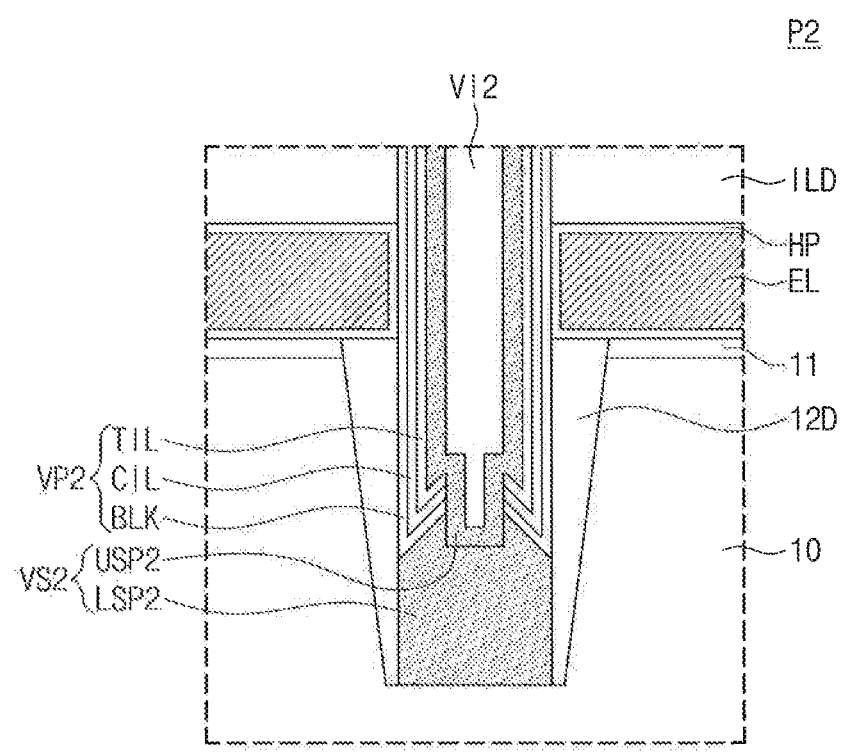
FIG. 5B is an enlarged sectional view of a portion 'P2' of FIG. 4A.

FIGS. 3A and 3B are plan views illustrating a three-dimensional semiconductor memory device according to some embodiments of the inventive concept. FIGS. 4A, 4B, and FIG. 4C am sectional views of the semiconductor memory device, which illustrate a three-dimensional semiconductor memory device according to some embodiments of the inventive concept and are taken along lines A-A', B-B', and C-C', respectively, of FIG. 3A. FIG. 5A is an enlarged sectional view of a portion 'P1' of FIG. 4A, and FIG. 5B is an enlarged sectional view of a portion 'P2' of FIG. 4A.

Referring now to FIGS. 3A, 4A, 4B, and 4C, a substrate 10 may include a cell array region CAR, a connection region CNR, and a peripheral circuit region PCR. The connection region CNR may be positioned between the cell array region CAR and the peripheral circuit region PCR. The substrate 10 may include at least one of a semiconductor material (e.g., silicon), an insulating material (e.g., glass), or a semiconductor or conductive material covered with an insulating material. For example, the substrate 10 may be a silicon wafer, which is of a first conductivity type.

A peripheral logic structure PSTR may be provided on the peripheral circuit region PCR of the substrate 10 (FIGS. 4A, 4B, 4C, 5A, 5B), and the peripheral logic structure PSTR may include peripheral logic circuits for writing or reading data to or from memory cells. The peripheral logic circuits may include row and column decoders, a page buffer, and control circuits. The peripheral logic circuits may include, for example, high-voltage or low-voltage transistors, resistors, and capacitors.

In some embodiments of the inventive concept, the peripheral logic structure PSTR may include a peripheral gate stack PGS, source/drain impurity regions 13, and a peripheral insulating pattern 35. A device isolation layer 12P may be provided in the peripheral circuit region PCR of the substrate 10 to define a peripheral active region ACT. The peripheral gate stack PGS may be provided on the substrate 10 to cross the peripheral active region ACT. The peripheral gate stack PGS may include a peripheral gate insulating layer 21, a doped poly silicon layer 23, a gate metal layer 25, and a hard mask layer 27, which are sequentially stacked on the substrate 10. The source/drain impurity regions 13 may be impurity-doped regions, which are formed at two regions of the peripheral active region ACT located at both sides of the peripheral gate stack PGS. The peripheral insulating pattern 35 may include at least one insulating layer and may be provided to cover the peripheral gate stack PUS and the source/drain impurity regions 13.

A plurality of electrode structures ST may extend in a direction from the cell array region CAR toward the connection region CNR or in a first direction D1 and may be spaced apart from each other in a second direction D2. A buffer insulating layer 11 may be provided between the electrode structures ST and the substrate 10 and may include a silicon oxide layer.

Each of the electrode structures ST may include electrodes EL and insulating layers ILD, which are alternately and repeatedly stacked in a third direction D3 normal to a top surface of the substrate 10. The electrodes EL may have substantially the same thickness, and thicknesses of the insulating layers ILD may be changed depending on technical requirements for the semiconductor memory device. In one example, a thickness of each of the insulating layers ILD may be less than that of each of the electrodes EL. For example, the thickness of the insulating layers in one embodiment may be about 5% less. In another embodiment, the thickness of the insulating layers may range from about 5% to 10%, and in another embodiment, the thickness may be 20% to 30% less. An artisan understands and appreciates that according to the inventive concept, the thickness of the ILDs relative to the thickness of the electrodes EL is not limited to the aforementioned thicknesses, which are provided for illustrative purposes.

With regard to the type of substances. In terms of construction, the electrodes EL may include at least one of doped semiconductor (e.g., doped silicon and so forth), metals (e.g., tungsten, copper, aluminum, alloys, and so forth), conductive metal nitrides (e.g., titanium nitride, tantalum nitride, and so forth), or transition metals (e.g., titanium, tantalum, and so forth). The insulating layers ILD may include, for example, a silicon oxide layer or a low-k dielectric layer. Again, an artisan should understand and appreciate that the inventive concept is not limited aforementioned compositions of the electrodes EL and the insulating layers ILD.

The electrode structures ST may have the staircase structure on the connection region CNR. In detail, lengths of the electrodes EL in the first direction D1 may decrease with increasing distance from the substrate 10, and heights of the electrode structures ST may decrease with increasing distance from the cell array region CAR. In addition, side surfaces of the electrodes EL may be spaced apart from each other, by a constant distance, in the first direction D1.

Each of the electrodes EL may have a pad portion positioned on the connection region CNR, and the pad portion of each of the electrodes EL on the connection region CNR may be exposed by an insulating layer ILD directly provided thereon. The pad portions of the electrodes EL may be spaced apart from each other in horizontal and vertical directions. For example, when measured in the first direction D1, a length of each of the electrodes EL may be greater than a length of another electrode directly provided thereon.

In some embodiments, the three-dimensional semiconductor memory device may be a vertical-type NAND FLASH memory device, and in this case, the electrodes EL of the electrode structure ST may be used as control gate electrodes of the memory cell transistors MCT of FIG. 2. For example, the electrodes EL may be used as the ground selection line GSL, the word lines WL0-WLn and DWL and the string selection lines SSL1 and SSL2 described with reference to FIG. 2.

In some embodiments, dummy insulating patterns 12D may be provided in the connection region CNR of the substrate 10, and the electrode structures ST may extend onto the dummy insulating patterns 12D. In other words, the dummy insulating patterns 12D may be positioned below the staircase structure of the electrode structures ST. The dummy insulating patterns 12D may be formed of an insulating material (e.g., silicon oxide). The dummy insulating patterns 12D may be spaced apart from each other in the first direction D1 and the second direction D2, as shown in FIGS. 3A and 3B. A width of the dummy insulating patterns 12D in the first or second direction D1 or D2 may be less than a width of the electrode structure ST in the second direction D2. In addition, a height of the dummy insulating patterns 12D may be substantially the same as that of the device isolation layer 12P. In other words, the dummy insulating patterns 12D may have bottom surfaces that are substantially coplanar with that of the device isolation layer 12P.

A planarized insulating layer 50 may be provided on the substrate 10 provided with the electrode structures ST. The planarized insulating layer 50 may be provided to cover the electrode structures ST on the connection region CNR and to have a substantially flat top surface. The planarized insulating layer 50 may include a single insulating layer or a plurality of stacked insulating layers. The planarized insulating layer 50 may be provided to cover the staircase structure of the electrode structures ST and to cover the peripheral circuit structure PSTR on the peripheral circuit region PCR. The mine planarized insulating layer 50 may include a single insulating layer or a plurality of stacked insulating layers and, for example, may include a silicon oxide layer and/or a low-k dielectric layer.

A plurality of first vertical structures VS1 may be provided to penetrate each of the electrode structures ST on the cell array region CAR and may be connected to the substrate 10. When viewed in a plan view, the first vertical structures VS1 may be arranged in the first direction D1 to form a zigzag arrangement. The first vertical structures VS1 may include a semiconductor material (e.g., silicon (Si), germanium (Ge), or mixtures thereof). In certain embodiments, the first vertical structures VS1 may be formed of or include a doped semiconductor material or an intrinsic semiconductor material. The first vertical structures VS1 containing the semiconductor material may be used as channel regions of the selection transistors SST and GST and the memory cell transistors MCT described with reference to FIG. 2.

In some embodiments, each of the first vertical structures VS1 may include a first lower semiconductor pattern LSP1 and a first upper semiconductor pattern USP1. In detail, referring to FIGS. 4A, 4B, and 5A, the first lower semiconductor pattern LSP1 may be in direct contact with the substrate 10 and may include a pillar-shaped epitaxial layer grown from the substrate 10.

The first lower semiconductor pattern LSP1 may be formed of or include at least one of silicon (Si), germanium (Ge), silicon-germanium (SiGe), III-V semiconductor compounds, and/or II-VI semiconductor compounds. The first lower semiconductor pattern LSP1 may be an undoped pattern or may be a doped pattern that is doped to have the same conductivity type as that of the substrate 10.

The first lower semiconductor pattern LSP1 may have a first height T1 in the third direction D3, and the first height T1 may be larger than a thickness of the lowermost one of the electrodes EL. The first lower semiconductor pattern LSP1 may have a top surface that is positioned at a level higher than that of a top surface of the lowermost one of the electrodes EL of the electrode structure ST. The top surface of the first lower semiconductor pattern LSP1 may be positioned at a level lower than a top surface of the lowermost insulating layer ILD provided on the lowermost one of the electrodes EL.

A gate insulating layer 15 may be provided on a portion of a side surface of the first lower semiconductor pattern LSP1. The gate insulating layer 15 may be provided between the lowermost one of the electrodes and the first lower semiconductor pattern LSP1. The gate insulating layer 15 may include a silicon oxide layer (e.g., a thermally-grown oxide layer). The gate insulating layer 15 may have a rounded side surface.

The first upper semiconductor pattern USP1 may be in direct contact with the first lower semiconductor pattern LSP1 and may have a bottom-closed pipe or a 'U'-shape. An internal space of the first upper semiconductor pattern USP1 may be filled with a first insulating gapfill pattern VI1 including an insulating material.

The first upper semiconductor pattern USP1 may have a bottom surface positioned at a level lower than that the top surface of the first lower semiconductor pattern LSP1. The first upper semiconductor pattern USP1 may be formed of or include an undoped semiconductor material or a doped semiconductor material having substantially the same conductivity type as that of the substrate 10. The first upper semiconductor pattern USP1 may have a different crystal structure from that of the first lower semiconductor pattern LSP1 and may have at least one of, for example, single- or poly-crystalline or amorphous structures. A bit-line conductive pad PAD1, which is coupled with a bit line contact plug BPLG, may be provided on a top portion of the first vertical structures VS1 (i.e., a top portion of the first upper semiconductor pattern USP1).

A first vertical insulating pattern VP1 may be provided between the electrode structure ST and the first upper semiconductor pattern USP1. The first vertical insulating pattern VP1 may extend in the third direction D3 and may surround the side surface of the first upper semiconductor pattern USP1. In other words, the first vertical insulating pattern VP1 may be shaped like a pipe or macaroni having opened top and bottom portions.

In detail, referring to FIGS. 4A, 4B, and 5A, the first vertical insulating pattern VP1 may be in contact with a portion of the top surface of the first lower semiconductor pattern LSP1. A bottom surface of the first vertical insulating pattern VP1 may be positioned at a higher level than the bottom surface of the first upper semiconductor pattern USP1.

The first vertical insulating pattern VP1 may be composed of one or more layers. In some embodiments, the first vertical insulating pattern VP1 may be used as a data storing layer of a NAND FLASH memory device and may include a tunnel insulating layer TIL, a charge storing layer CIL, and a blocking insulating layer BLK. For example, the charge storing layer CIL may be a trap insulating layer, a floating gate electrode, or an insulating layer with conductive nano dots. In detail, the charge storing layer CIL may include at least one of a silicon nitride layer, a silicon oxynitride layer, a silicon-rich nitride layer, a nanocrystalline silicon layer, or a laminated trap layer. The tunnel insulating layer TIL may be formed of at least one of materials, whose band gaps are greater than that of the charge storing layer CIL, and the blocking insulating layer BILK may be formed of a high-k dielectric material (e.g., aluminum oxide and hafnium oxide). In certain embodiments, the first vertical insulating pattern VP1 may be used as a memory element of a phase-change memory device or a variable resistance memory and may include a phase-change or variable-resistance Layer.

A plurality of second vertical structures VS2 may be provided on the connection region CNR to penetrate the planarized insulating layer 50, the electrode structures ST, and the dummy insulating patters 12D. The second vertical structures VS2 may have bottom surfaces lower than those of the first vertical structures VS1. The second vertical structures VS2 may have top surfaces positioned at substantially the same level as those of the first vertical structures VS1. The second vertical structures VS2 may be formed of or include the same semiconductor material as the first vertical structures VS1.

In more detail, the second vertical structures VS2 may be provided to penetrate the staircase structure of the electrode structure ST, and the number of the electrodes EL intersected with each of the second vertical structures VS2 may decrease with decreasing distance from the peripheral circuit region PCR. When viewed in a plan view, the second vertical structures VS2 may be arranged in the first direction D1 and the second direction D2 and may be provided to penetrate end portions of the electrodes EL on the connection region CNR. The second vertical structures VS2 may be provided to penetrate the dummy insulating patterns 12D and may be connected to the substrate 10.

In some embodiments, an adjacent pair of the second vertical structures VS2 in the second direction D2 may be provided to penetrate a corresponding one of the dummy insulating patterns 12D, as shown in FIG. 3A. In certain embodiments, each of the second vertical structures VS2 my be provided to penetrate a corresponding one of the dummy insulating patterns 12D, as shown in FIG. 3B.

Each of the second vertical structures VS2 may include a second lower semiconductor pattern LSP2 and a second upper semiconductor pattern USP2. In detail, referring to FIGS. 4A, 4B, 4C, and 5B, the second lower semiconductor pattern LSP2 may be provided in the dummy insulating pattern 12D to be in direct contact with the substrate 10. A bottom surface of the second lower semiconductor pattern LSP2 may be in direct contact with the substrate 10, and a side surface of the second lower semiconductor pattern LSP2 may be in direct contact with the dummy insulating pattern 12D. The second lower semiconductor pattern LSP2 may have the second height T2 less than the first height T1, in the third direction D3. A top surface of the second lower semiconductor pattern LSP2 may be positioned at a level lower than a bottom surface of the lowermost one of the electrodes EL of the electrode structure ST. The second lower semiconductor pattern LSP2 may include a pillar-shaped epitaxial layer grown from the substrate 10. The second tower semiconductor pattern LSP2 may be formed of or include the same semiconductor material as the first lower semiconductor pattern LSP1.

The second upper semiconductor pattern USP2 may be in direct contact with the second lower semiconductor pattern LSP2 and may have a bottom-closed pipe or a 'U'-shape. An internal space of the second upper semiconductor pattern USP2 may be filled with a second insulating gapfill pattern VI2 including an insulating material. The second upper semiconductor pattern USP2 may have a bottom surface, which is positioned at a level lower than that of the lowermost one of the electrodes EL and is positioned at a level lower than that of the top surface of the second lower semiconductor pattern LSP2. The second upper semiconductor pattern USP2 may be formed of or include the same semiconductor material as the first upper semiconductor pattern USP1. A dummy conductive pad PAD2 may be provided in top portions of the second vertical structures VS2 (e.g., a top portion of the second upper semiconductor pattern USP2) to have substantially the same structure as the bit line conductive pad PAD1.

A second vertical insulating pattern VP2 may be provided between the electrode structure ST and the second upper semiconductor pattern USP2. The second vertical insulating pattern VP2 may extend in the third direction D3 and between the dummy insulating pattern 12D and the second upper semiconductor pattern USP2. The second vertical insulating pattern VP2 may be shaped like a pipe or macaroni having opened top and bottom portions, similar to the first vertical insulating pattern VP1.

In detail, referring to FIGS. 4A, 4B, 4C, and 5B, the second vertical insulating pattern VP2 may be in contact with a portion of the top surface of the second lower semiconductor pattern LSP2. A bottom surface of the second vertical insulating pattern VP2 may be lower than the bottom surface of the lowermost one of the electrodes EL and may be lower than a top surface of the dummy insulating pattern 12D.

Similar to the first vertical insulating pattern VP1, the second vertical insulating pattern VP2 may be composed of one or more layers. In some embodiments, them second vertical insulating pattern VP2 ma include the tunnel insulating layer TIL, the charge storing layer CIL, and the blocking insulating layer BLK and may be used as a data Storing layer of a NAND FLASH memory device.

Furthermore, referring to FIGS. 5A and 5B, a horizontal insulating pattern HP may be provided between side surfaces of the electrodes EL and the first vertical insulating pattern VP1 and between the side surfaces of the electrodes EL and the second vertical insulating pattern VP2. The horizontal insulating pattern HP may be extended from the side surfaces of the electrodes EL to cover the top and bottom surfaces of the electrodes EL. The horizontal insulating pattern HP may include a portion that is placed between the gate insulating layer 15, at a side of the first lower semiconductor pattern LSP1, and the lowermost one of the electrodes EL, and another portion, which is extended from the portion to cover the top and bottom surfaces of the lowermost one of the electrodes EL. The horizontal insulating pattern HP may include the charge storing layer and the blocking insulating layer serving as the data storing layer of the NAND FLASH memory device. Alternatively, the horizontal insulating pattern HP may include a blocking insulating layer.

According to some embodiments of the inventive concept, the gate insulating layer 15 and the horizontal insulating pattern HP may be partially provided between the lowermost one of the electrodes EL and the first lower semiconductor pattern LSP1 on the cell array region CAR. The second vertical insulating pattern VP2 and the horizontal insulating pattern HP may be partially provided between the lowermost one of the electrodes EL and the second upper semiconductor pattern USP2 on the connection region CNR. In other words, a distance between the side surface of the lowermost one of the electrodes EL and the second upper semiconductor pattern USP2 on the connection region CNR may be different from the distance between the side surface of the lowermost one of the electrodes EL and the first lower semiconductor pattern LSP1 on the cell array region CAR. In some embodiments of the inventive concept, since a portion of the second vertical insulating pattern VP2 having a uniform thickness is placed between the lowermost one of the electrodes EL and the second upper semiconductor pattern USP2, it may be possible to electrically separate the second upper semiconductor pattern USP2 from the lowermost one of the electrodes EL.

Referring to FIGS. 3A, 4A, 4B, and 4C, common source regions CSR may be provided between adjacent ones of the electrode structures ST and in the substrate 10. The common source regions CSR may extend parallel to the electrode structures ST and in the first direction D1. The common source regions CSR may be formed by doping the substrate 10 with impurities of a second conductivity type. The common source regions CSR may contain, for example, n-type impurities (e.g., arsenic (As) or phosphorus (P)).

A first interlayered insulating layer 60 may be provided on the planarized insulating layer 50 to cover the top surfaces of the first and second vertical structures VS1 and VS2.

A common source plug CSP may be provided between the electrode structures ST and may be coupled with the common source region CSR. As an example, the common source plug CSP may extend in the first direction D1 and may have a substantially uniform upper width. In other words, insulating spacers SP may be interposed between the common source plug CSP and both side surfaces of the electrode structures ST. Alternatively, the common source plug CSP may be provided between the insulating spacers SP and may be locally coupled to the common source region CSR.

Cell contact plugs CPLG may be provided on the connection region CNR to penetrate the first interlayered insulating layer 60 and the planarized insulating layer 50 and may be coupled to the end portions of the electrodes EL, respectively. Vertical lengths of the cell contact plugs CPLG may decrease with decreasing distance from the cell array region CAR. In addition, the cell contact plugs CPLG may have top surfaces that are substantially coplanar with each other.

Peripheral contact plugs PPLG may be provided on the peripheral circuit region PCR to penetrate the first interlayered insulating layer 60 and the planarized insulating layer 50 and may be electrically to the peripheral logic circuits.

A second interlayered insulating layer 70 may be provided on the first interlayered insulating layer 60 to cover a top surface of the common source plug CSP.

Bit lines BL may be provided on the second interlayered insulating layer 70 and may extend in the second direction D2. The bit lines BL may be electrically connected to the first vertical structures VS1 through the bit line contact plugs BPLG.

Connection lines CL may lie provided on the second interlayered insulating layer 70 of the connection region CNR, and peripheral lines PCL may be provided on the second interlayered insulating layer 70 of the peripheral circuit region PCR. The connection lines CL may be connected to the cell contact plugs CPLG through connection contact plugs CCP penetrating the second interlayered insulating layer 70. The peripheral lines PCL may be connected to the peripheral contact plugs PPLG through peripheral connection contact plugs PCP penetrating the second interlayered insulating layer 70.

Figure 6:
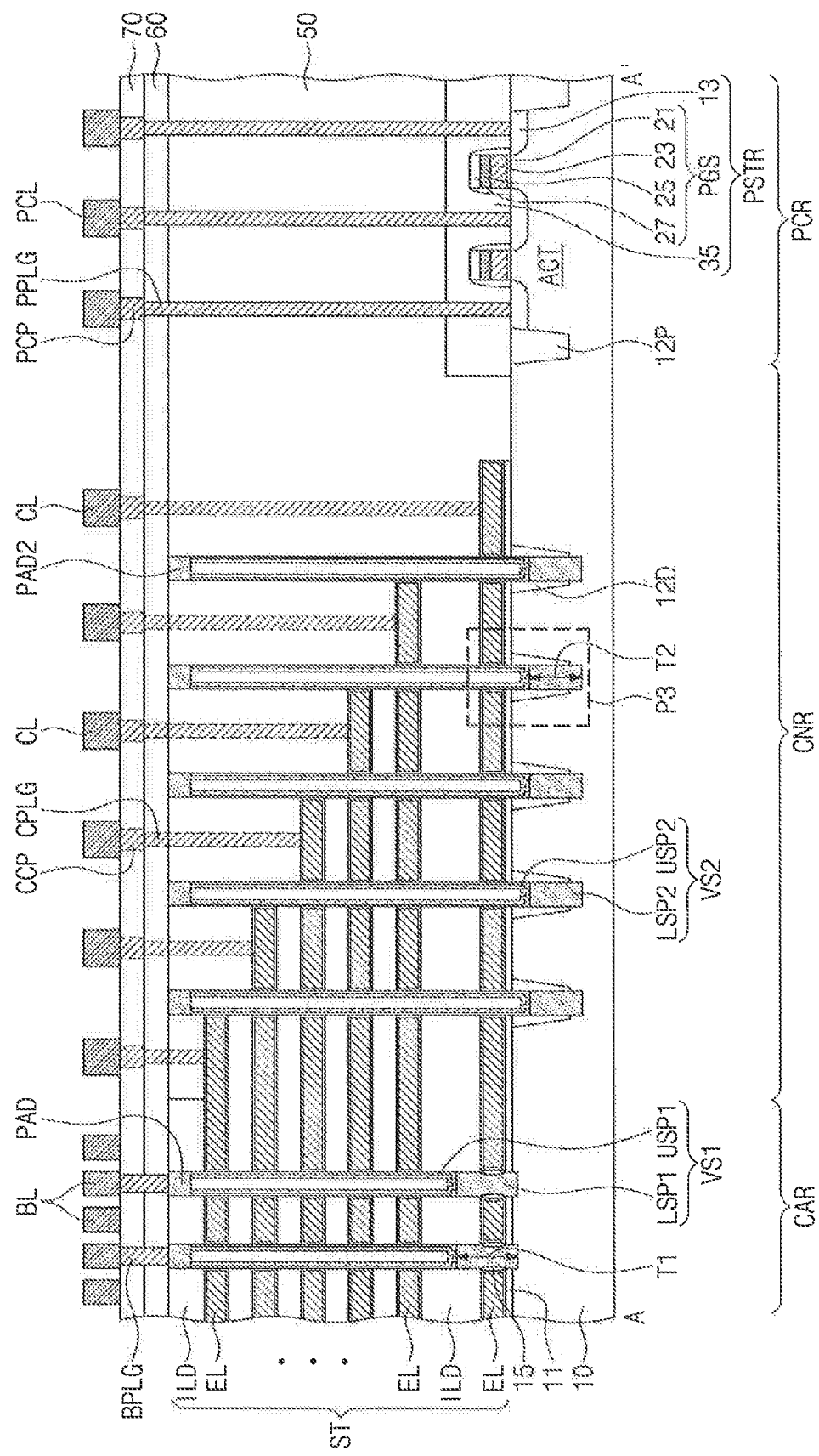
FIG. 6 is a sectional view which is taken along line A-A' of each of FIGS. 3A and 3B to illustrate a three-dimensional semiconductor memory device according to some embodiment of the inventive concept.
Figure 7:
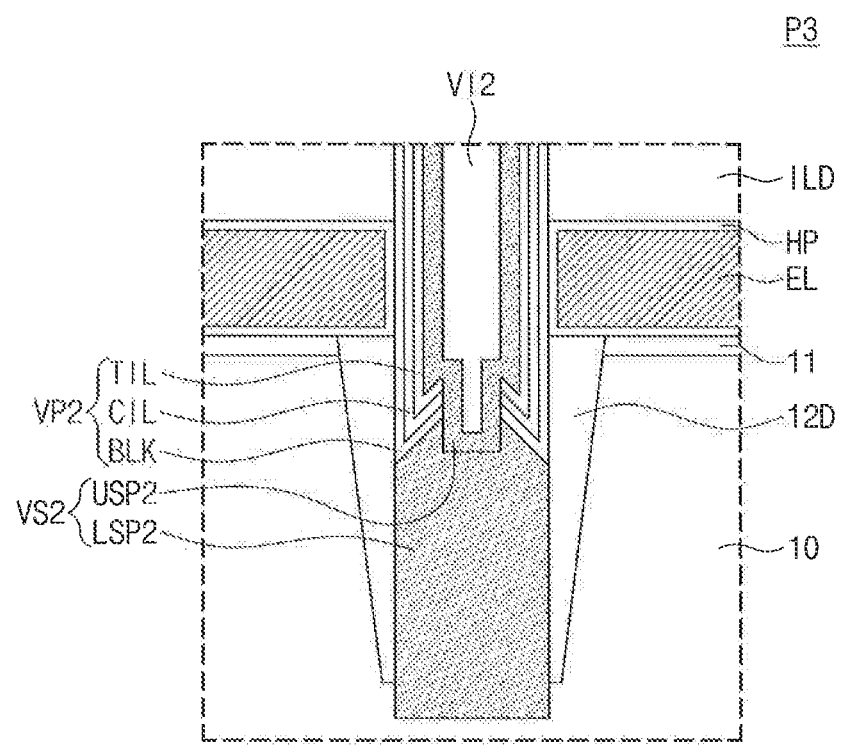
FIG. 7 is an enlarged sectional view of a portion 'P3' of FIG. 6.

FIG. 6 is a sectional view which is taken along line A-A' of each of FIGS. 3A and 3B to illustrate a three-dimensional semiconductor memory device according to some embodiments of the inventive concept. FIG. 7 is an enlarged sectional view of a portion 'P3' of FIG. 6. For concise description, an element previously described with reference to FIGS. 4A, 4B, 4C, 5A, and 5B may be identified by a similar or identical reference number without repeating an overlapping description thereof.

Referring to FIGS. 6 and 7, the second vertical structures VS2 may penetrate the dummy insulating patterns 12D, which are provided in the connection region CNR of the substrate 10, and may be connected to the substrate 10. Each of the second vertical structures VS2 may include the second lower semiconductor pattern LSP2 and the second upper semiconductor pattern USP2, as described above.

With continued reference to FIGS. 6 and 7, the second vertical structures VS2 may have bottom surfaces that are lower than those of the first vertical structures VS1 and lower than those of the dummy insulating patterns 12D. Accordingly, a lower side surface of the second lower semiconductor pattern LSP2 may be in contact with the substrate 10, and an upper side surface of the second lower semiconductor pattern LSP2 may be in contact with the dummy insulating pattern 12D. In addition, a second height T2 of the second lower semiconductor pattern LSP2 may be substantially equal to or smaller than the first height T1 of the first lower semiconductor pattern LSP1 of the first vertical structure VS1.

Figure 8:
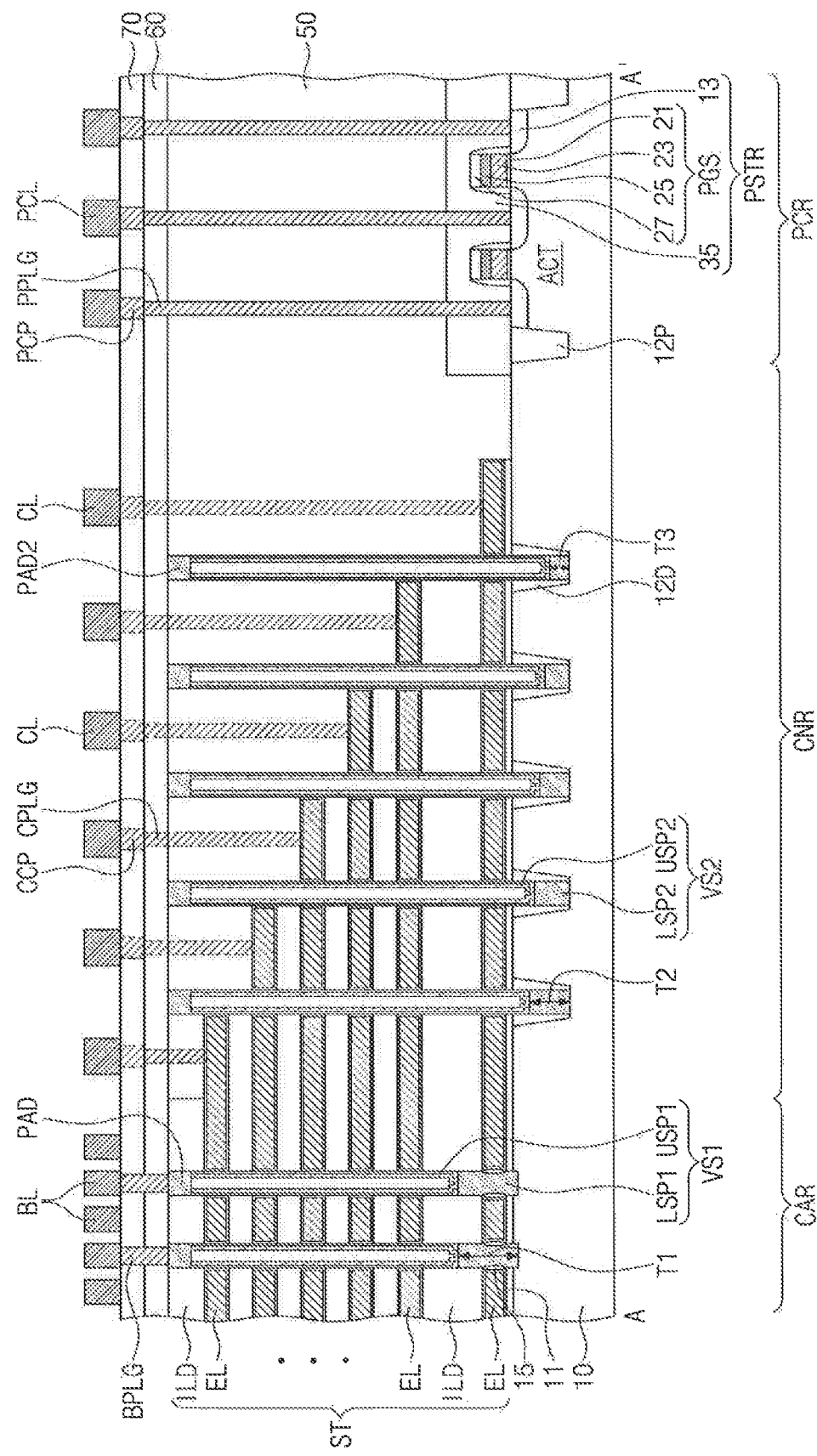
FIG. 8 is a sectional view which is taken along line A-A' of each of FIGS. 3A and 3B to illustrate a three-dimensional semiconductor memory device according to some embodiments of the inventive concept.

FIG. 8 is a sectional view which is taken along line A-A' of each of FIGS. 3A and 3B to illustrate a three-dimensional semiconductor memory device according to some embodiments of the inventive concept. For concise description, a previously-described element may be identified by a similar or identical reference number without repeating an overlapping description thereof.

Referring to FIG. 8, in the second vertical structures VS2 provided on the connection region CNR, the height of the second lower semiconductor patterns LSP2 may decrease with decreasing distance from the peripheral circuit region PCR. As an example, the second lower semiconductor pattern LSP2, which is closest to the cell array region CAR, may have a second height T2 smaller than the first height T1 of the first lower semiconductor pattern LSP1, and the second lower semiconductor pattern LSP2, which is closest to the peripheral circuit region PCR, may have a third height T3 smaller than the second height T2.

Figure 9A:
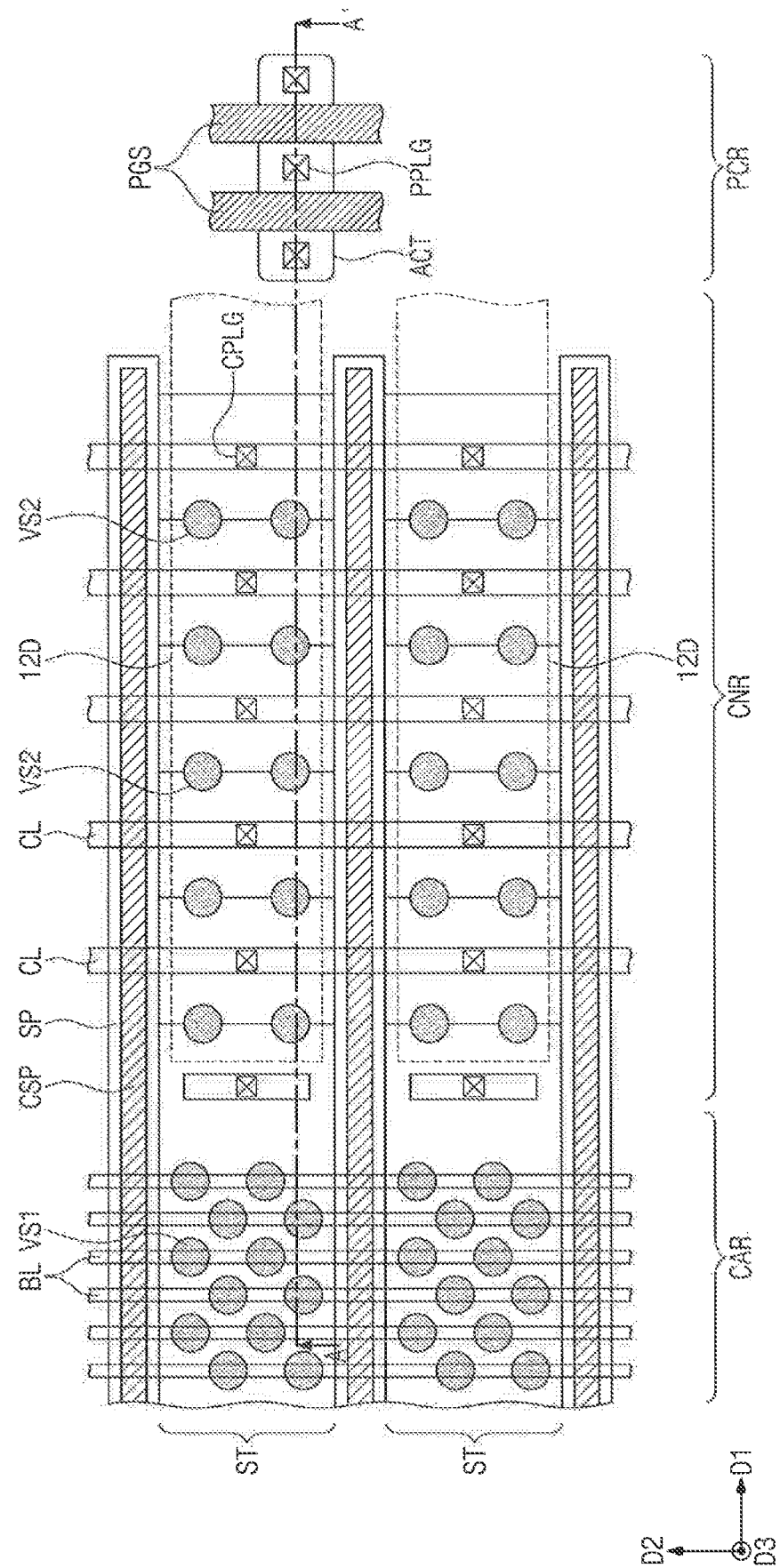
FIGS. 9A and 9B are plan views illustrating a three-dimensional semiconductor memory device according to some embodiments of the inventive concept with FIG. 9A and FIG. 9B having respective dummy patterns.
Figure 9B:
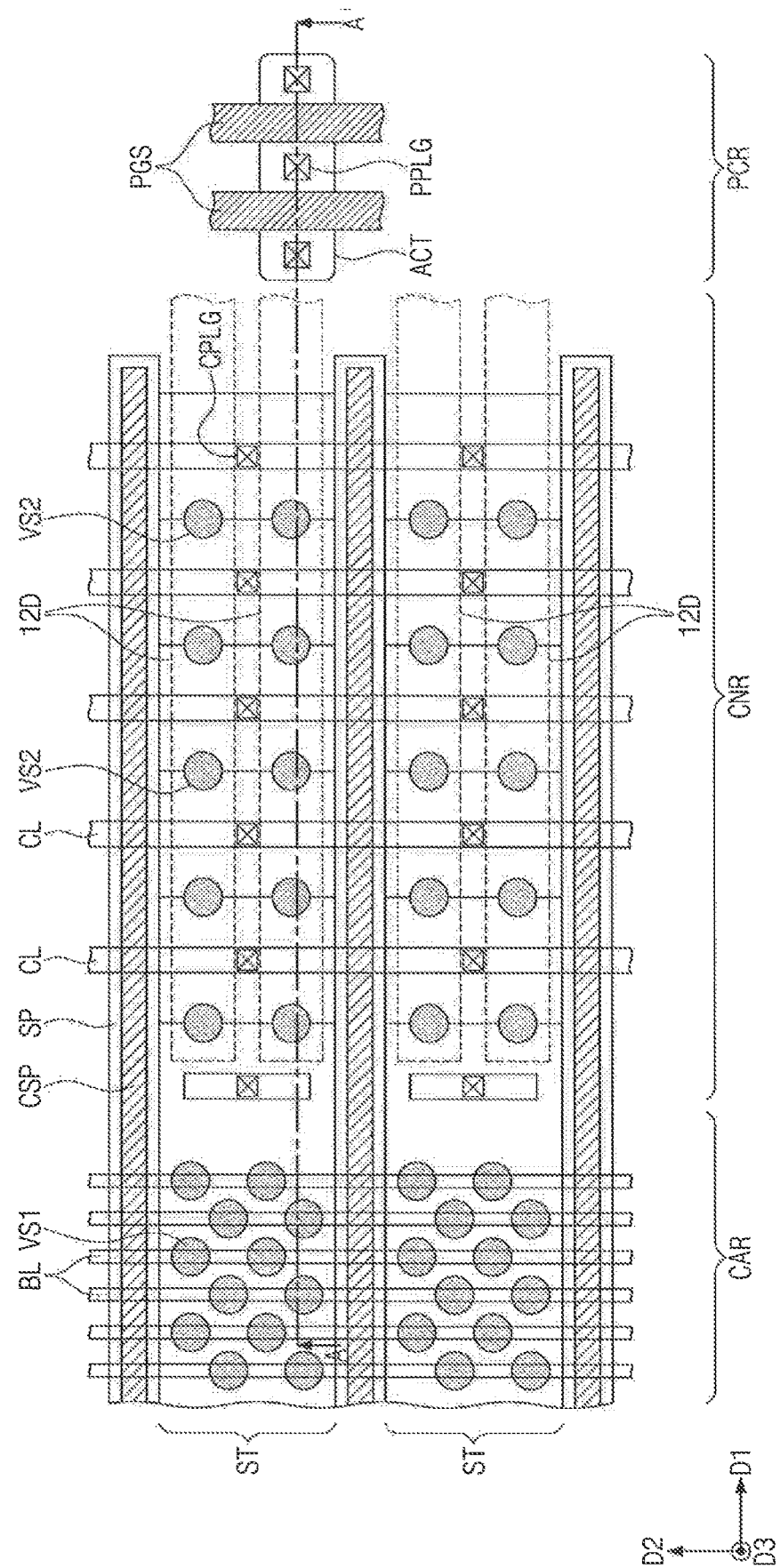
Figure 10:
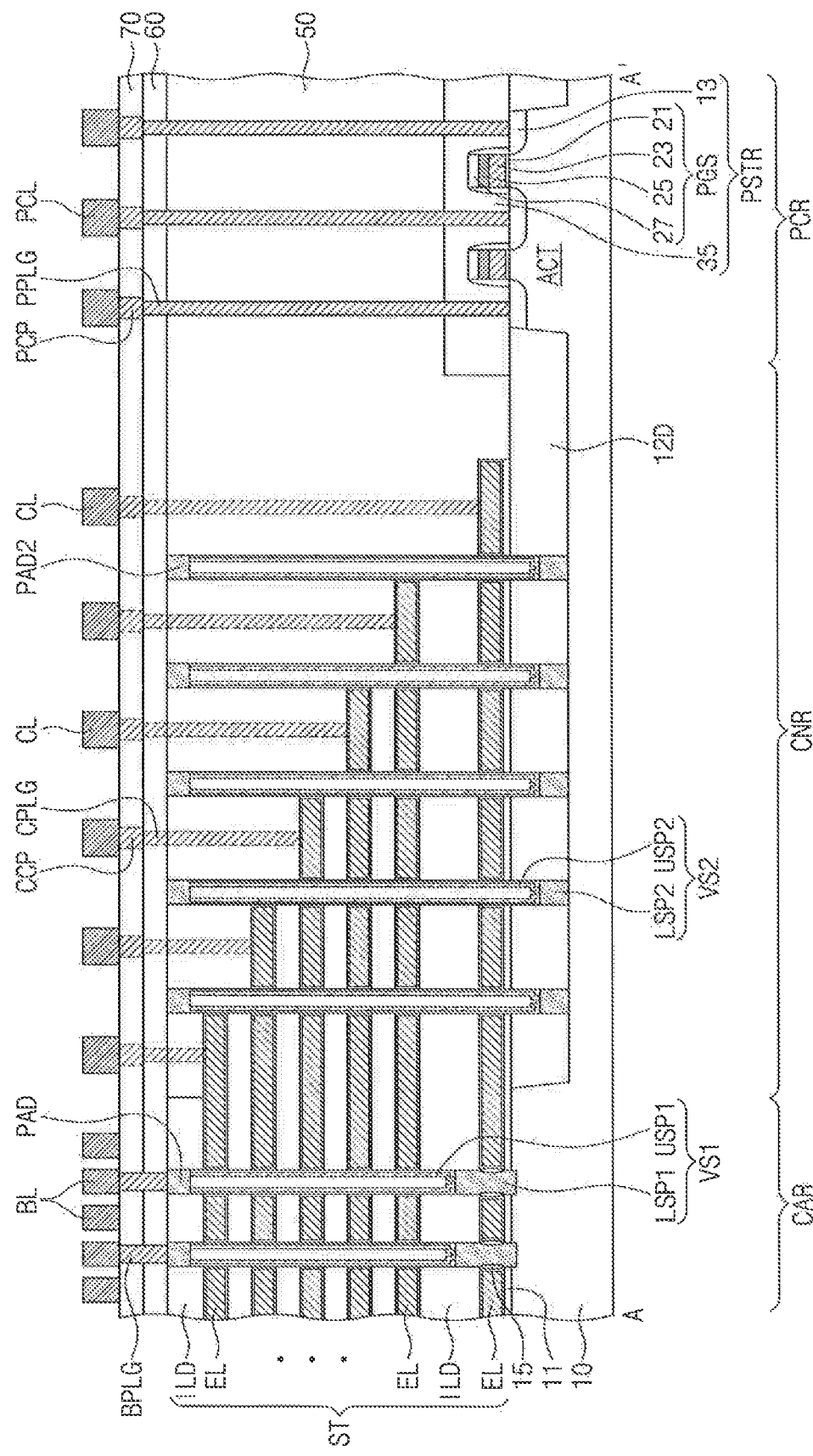
FIG. 10 is a sectional view which is taken along line A-A' of each of FIGS. 9A and 9B to illustrate a three-dimensional semiconductor memory device according to some embodiments of the inventive concept.

FIGS. 9A and 9B are plan views illustrating a three-dimensional semiconductor memory device according to some embodiments of the inventive concept. FIG. 10 is a sectional view which is taken along line A-A' of each of FIGS. 9A and 9B to illustrate a three-dimensional semiconductor memory device according to some embodiments of the inventive concept. For a more concise description, an element previously described with reference to FIGS. 4A, 4B, 4C, 5A, and 5B may be identified by a similar or identical reference number without repeating an overlapping description thereof.

Referring to FIGS. 9A, 9B, and 10, the dummy insulating patterns 12D may be provided in the connection region CNR of the substrate 10 and may be line-shaped structures extending in the first direction D1.

As an example, the dummy insulating patterns 12D may be provided below the electrode structures ST, respectively, on the connection region CNR. In other words, when viewed in a plan view, each of the dummy insulating patterns 12D may be overlapped with the staircase structure of the electrode structure ST. As another example, as shown in FIG. 9B, a pair of the dummy insulating patterns 12D extending in the first direction D1 may be provided below each of the electrode structures ST. In the case where, like this, the dummy insulating patterns 12D have a line shape, a plurality of the second vertical structures VS2 may penetrate one of the dummy insulating patterns 12D and may be connected to the substrate 10.

Figure 11:
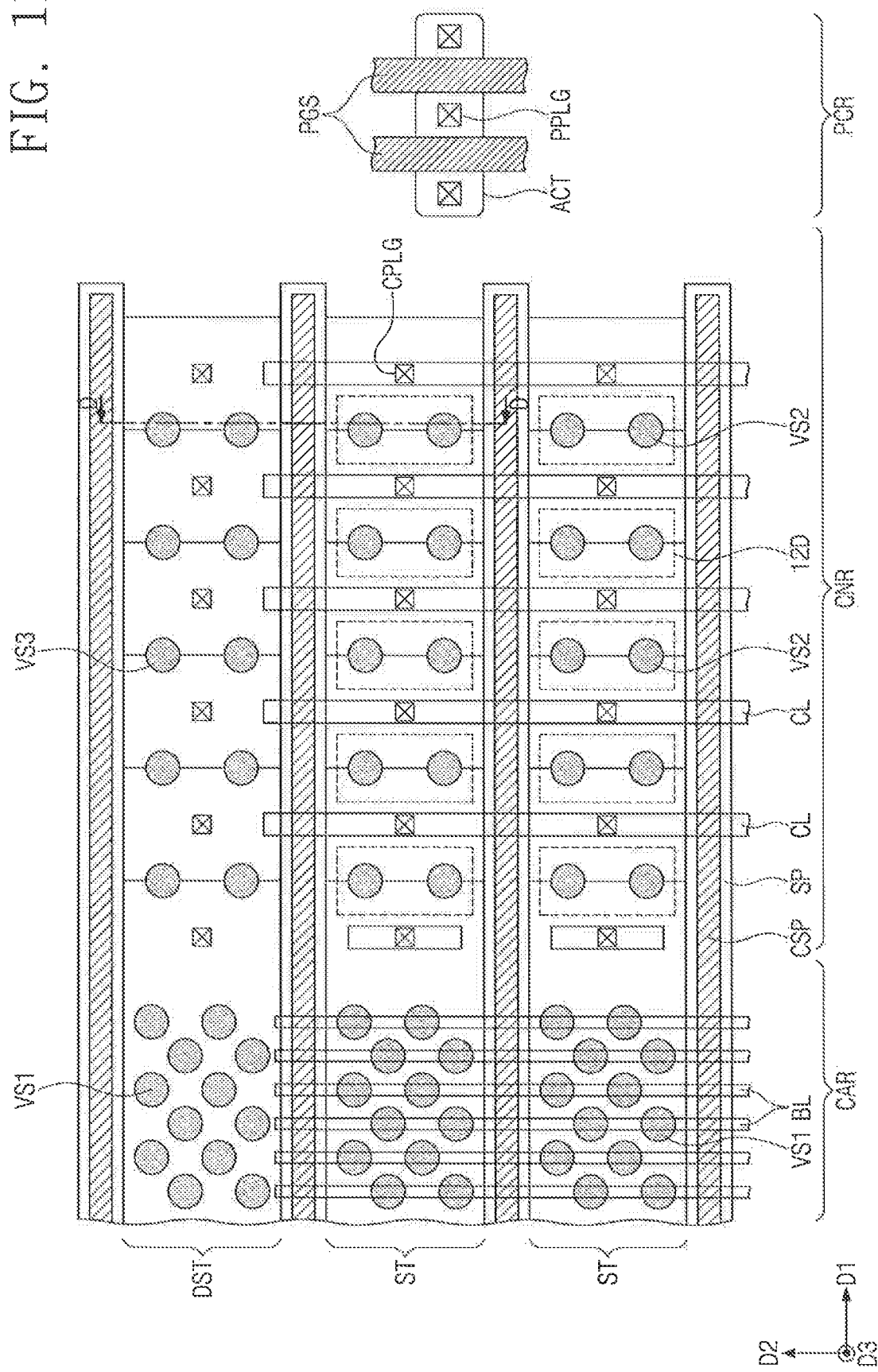
FIG. 11 is a plan view illustrating a three-dimensional semiconductor memory device according to some embodiments of the inventive concept.
Figure 12:
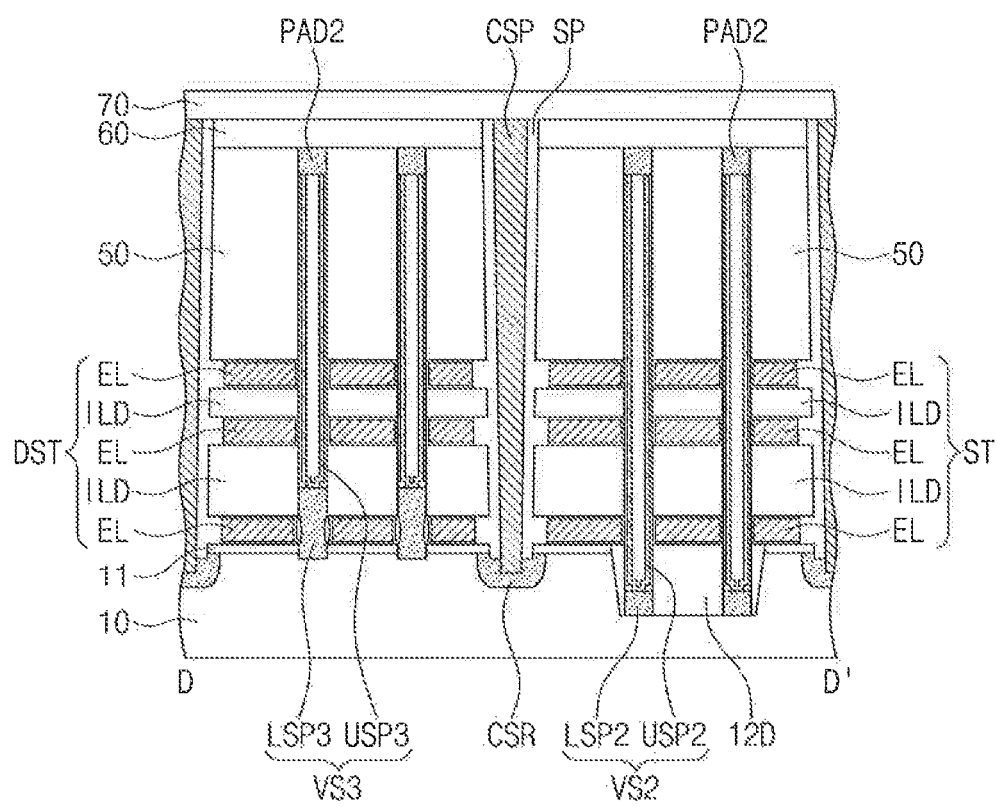
FIG. 12 is a sectional view taken along line D-D' of FIG. 11.

FIG. 11 is a plan view illustrating a three-dimensional semiconductor memory device according to some embodiments of the inventive concept. FIG. 12 is a sectional view taken along line D-D' of FIG. 11. For concise description, an element previously described with reference to FIGS. 4A, 4B, 4C, 5A, and 5B may be identified by a similar or identical reference number without repeating an overlapping description thereof.

Referring to FIGS. 11 and 12, a plurality of the electrode structures ST may be provided on the substrate 10 to extend in the first direction D1 from the cell array region CAR to the connection region CNR. Each of the electrode structures ST may include a plurality of the electrodes EL, which are sequentially stacked on the substrate 10 to form a staircase structure on the connection region CNR, as described above.

In some embodiments, a dummy electrode structure DST may extend parallel to the electrode structures ST and in the first direction D1. Similar to the electrode structures ST, the dummy electrode structure DST may include a plurality of the electrodes EL, which are sequentially stacked on the substrate 10 to form a staircase structure on the connection region CNR.

The first vertical structures VS1 may be provided on the cell array region CAR to penetrate each of the electrode structures ST and the dummy electrode structure DST. In some embodiments, the first vertical structures VS1 penetrating the dummy the electrode structure ST may not be connected to the bit lines BL and may be in an electrically floating state. The second vertical structures VS2 may be provided on the connection region CNR to penetrate each of the electrode structures ST, and third vertical structures VS3 may be provided on the connection region CNR to penetrate the dummy electrode structure DST.

As described above, each of the first vertical structures VS1 may include the first lower semiconductor pattern LSP1 and the first upper semiconductor pattern USP1, and each of the second vertical structures VS2 may include the second lower semiconductor pattern LSP2 and the second upper semiconductor pattern USP2. Here, the top surface of the first lower semiconductor pattern LSP1 may be higher than the top surface of the lowermost one of the electrodes EL. The second lower semiconductor pattern LSP2 may penetrate the dummy insulating pattern 12D, and the top surface of the second lower semiconductor pattern LSP2 may be lower than the bottom surface of the lowermost one of the electrodes EL.

In some embodiments, each of the third vertical structures VS3 may include a third lower semiconductor pattern LSP3 and a third upper semiconductor pattern USP3, similar to the first vertical structures VS1. The third lower semiconductor pattern LSP3 may be in direct contact with the substrate 10 and may have a bottom surface that is higher than the bottom surface of the second lower semiconductor pattern LSP2. A top surface of the third lower semiconductor pattern LSP3 may be higher than the top surface of the lowermost one of the electrodes EL, like the first lower semiconductor pattern LSP1 shown in FIG. 4A. In certain embodiments, a height of the third lower semiconductor pattern LSP3 may be less than that of the first lower semiconductor pattern LSP1, and in this case, the top surface of the third lower semiconductor pattern LSP3 may be lower than the top surface of the lowermost one of the electrodes EL.

Figure 13A:
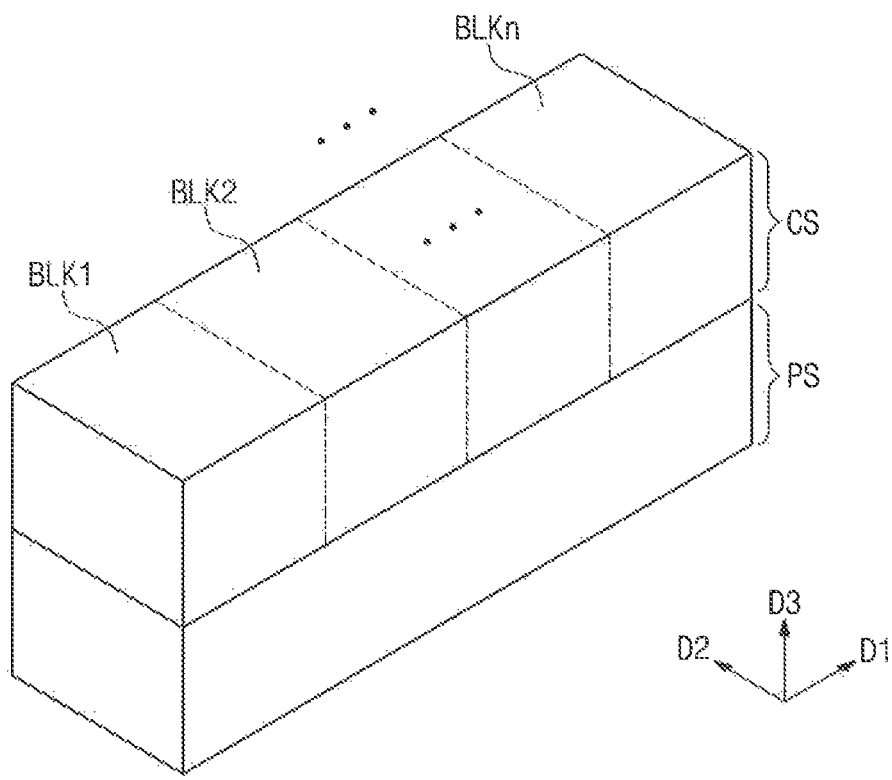
FIG. 13A is a schematic block diagram illustrating a three-dimensional semiconductor memory device according to some embodiments of the inventive concept.
Figure 13B:
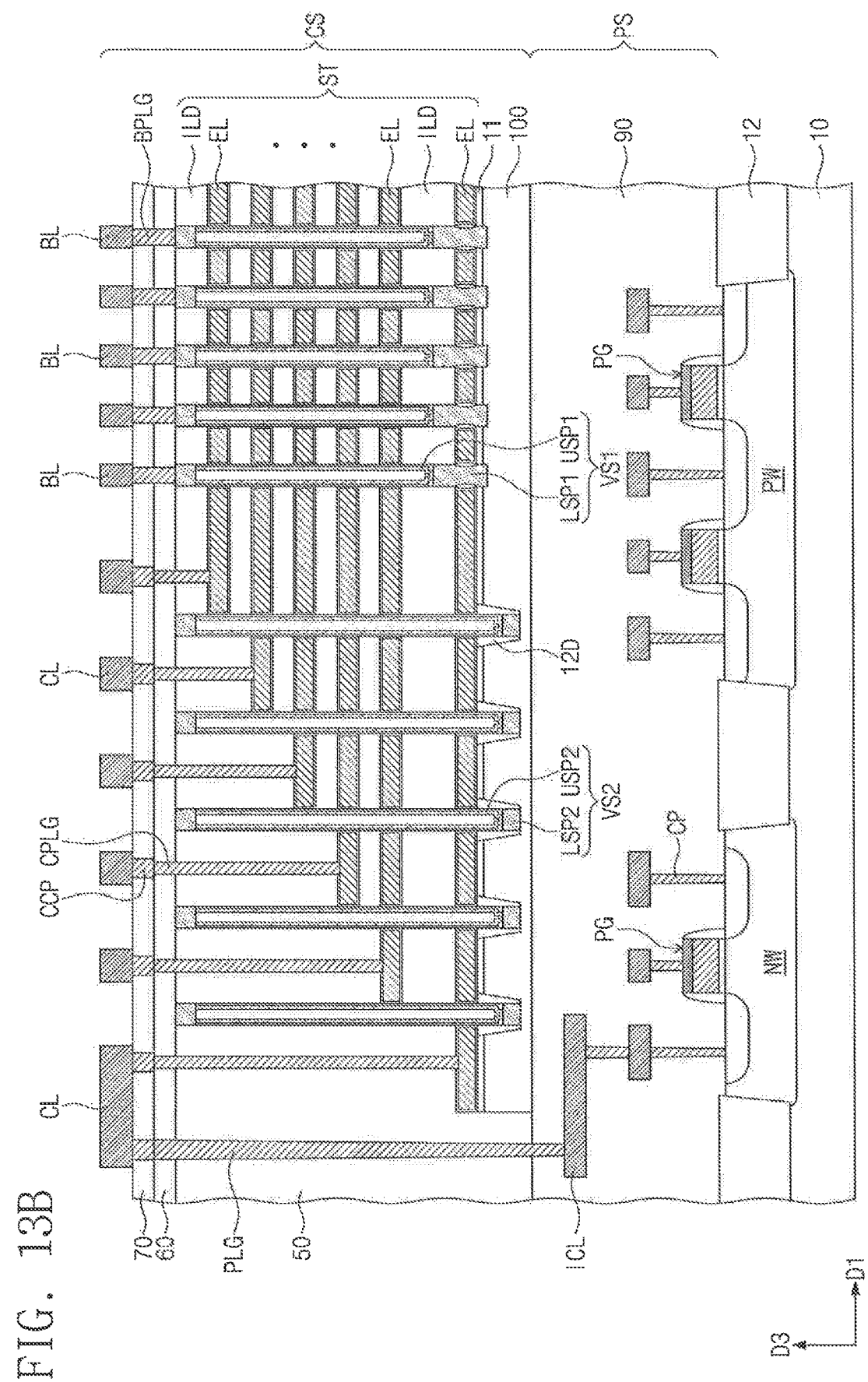
FIG. 13B is a sectional view illustrating a three-dimensional semiconductor memory device according to some embodiments of the inventive concept.

FIG. 13A is a schematic block diagram illustrating a three-dimensional semiconductor memory device according to some embodiments of the inventive concept. FIG. 13B is a sectional view illustrating the three-dimensional semiconductor memory device of FIG. 13A. For concise description, a previously-described element may be identified by a similar or identical reference number without repeating an over description thereof.

Referring to FIG. 13A, the three-dimensional semiconductor memory device may include a peripheral logic structure PS and a cell may structure CS, and the cell array structure CS may be stacked on the peripheral logic structure PS. In other words, the peripheral logic structure PS and the cell array structure CS may be overlapped with each other, when viewed in a plan view.

In some embodiments, the peripheral logic structure PS may include the row and column decoders, the page buffer, and the control circuits described with reference to FIG. 1. The cell array structure CS may include a plurality of memory blocks BLK1-BLKn, each of which is configured to independently perform an erase operation. The memory blocks BLK1-BLKn may include a structure stacked in the third direction D3, on a plane parallel to the first and second directions D1 and D2. Each of the memory blocks BLK1-BLKn may include a memory cell array having a three-dimensional structure or a vertical structure. The memory cell array may include a plurality of memory cells, which are arranged three-dimensionally, and a plurality of word lines and a plurality of bit lines, which are electrically connected to the memory described with reference to FIG. 2.

Referring to FIG. 13B, the peripheral logic structure PS and the cell array structure CS may be sequentially stacked on the substrate 10. In other words, the peripheral logic structure PS may be provided between the substrate 10 and the cell array structure CS, when viewed in a vertical section. That is, the peripheral logic structure PS and the cell array structure CS may be overlapped with each other, when viewed in a plan view.

The substrate 10 may be, for example, a bulk silicon wafer, a silicon-on-insulator (SOI) wafer, a germanium wafer, a germanium-on-insulator (GOI) wafer, a silicon-germanium wafer, or a substrate 10 including an epitaxial layer formed by a selective epitaxial growth (SEG) process.

The substrate 10 may include an n-well region NW doped with n-type impurities and a p-well region PW doped with p-type impurities. A device isolation layer 12 may be provided in the n-well region NW and the p-well region PW to define active regions.

The peripheral logic structure PS may include high- and low-voltage transistors, resistors, and capacitors. In some embodiments, the peripheral logic structure PS may include peripheral gate electrodes PG, source/drain impurity regions 13, which are formed at both sides of each of the peripheral gate electrodes PG, the peripheral circuit plugs CP, peripheral circuit lines ICL, and a planarized insulating gapfill layer 50 covering peripheral circuits. For example, PMOS transistors may be formed on the n-well region NW, and NMOS transistors may be formed on the p-well region PW. The peripheral circuit lines ICL may be electrically connected to the peripheral circuits via the peripheral circuit plugs CP. For example, the peripheral circuit plugs CP and the peripheral circuit lines ICL may be connected to the NMOS and PMOS transistors.

A lower insulating gapfill layer 90 may be provided to cover the peripheral circuits, the peripheral circuit plugs CP, and the peripheral circuit lines ICL. The lower insulating gapfill layer 90 may include a plurality of vertically-stacked insulating layers.

The cell array structure CS may be provided on the lower insulating gapfill layer 90 and may include a horizontal semiconductor layer 100, the electrode structures ST, and the first and second vertical structures VS1 and VS2.

The horizontal semiconductor layer 100 may be formed on a top surface of the lower insulating gapfill layer 90 covering the peripheral circuits. In other words, the horizontal semiconductor layer 100 may be in contact with the lower insulating gapfill layer 90. The horizontal semiconductor layer 100 may include the cell array region CAR and the connection region CNR, which is positioned adjacent to the cell array region CAR, as described with reference to FIGS. 4A, 4B, and 4C.

The horizontal semiconductor layer 100 may be formed of, or include at least one of, semiconductor materials (e.g., silicon (Si), germanium (Ge), silicon germanium (SiGe), gallium arsenic (GaAs), indium gallium arsenic (InGaAs), aluminum gallium arsenic (AlGaAs), or mixtures thereof). In addition, the horizontal semiconductor layer 100 may be formed of or include a doped semiconductor material of a first conductivity type or an intrinsic semiconductor material. Furthermore, the horizontal semiconductor layer 100 may have at least one of single- or poly-crystalline structures or an amorphous structure.

In addition, the dummy insulating patterns 12D may be provided in the horizontal semiconductor layer 100, and the buffer insulating layer 11 may be formed on a top surface of the horizontal semiconductor layer 100. The electrode structures ST may be provided on the buffer insulating layer 11. As described with reference to FIGS. 4A, 4B, and 4C, the electrode structures ST may be provided on the horizontal semiconductor layer 100 to extend in the first direction D1 and may be spaced apart from each other in the second direction D2. Each of the electrode structures ST may include the electrodes EL, which are vertically stacked on the horizontal semiconductor layer 100, and the insulating layers ILD, each of which is provided between the electrodes EL.

As described above, the electrode structures ST may be provided to have a staircase structure on the connection region CNR, and the staircase structure may make it possible to allow the electrodes EL to be electrically connected to the peripheral logic structure PS. The planarized insulating layer 50 may be provided on the horizontal semiconductor layer 100 to cover the end portions of the electrodes EL having the staircase structure.

The first vertical structures VS1 may be arranged so as to penetrate, each of the electrode structures ST and may be electrically connected to the horizontal semiconductor layer 100. The second vertical structures VS2 may be provided to penetrate the planarized insulating layer 50, the electrode structures ST and the dummy insulating patterns 12D and to be in contact with the horizontal semiconductor layer 100. As described above, the first and second vertical structures VS1 and VS2 may include the first and second lower semiconductor patterns LSP1 and LSP2 and the first and second upper semiconductor patterns USP1 and USP2.

An interconnection structure may be provided on the end portions of the electrode structures ST (i.e., on the staircase structure) to electrically connect the cell array structure CS to the peripheral logic structure PS. The interconnection structure may include the cell contact plugs CPLG, which are connected to the end portions of the electrodes EL through the planarized insulating layer 50, the connection lines CL, which are provided on the planarized insulating layer 50 and are connected to the cell contact plugs CPLG, and the connection contact plugs PLG, which are provided to penetrate the planarized insulating layer 50 and the horizontal semiconductor layer 100 and are coupled to the peripheral circuit lines ICL of the peripheral logic structure PS.

FIGS. 14 to 19 are sectional views which are taken along line A-A' of FIGS. 3A and 3B to illustrate a method of fabricating a three-dimensional semiconductor memory device, according to some embodiments of the inventive concept.

Figure 14:
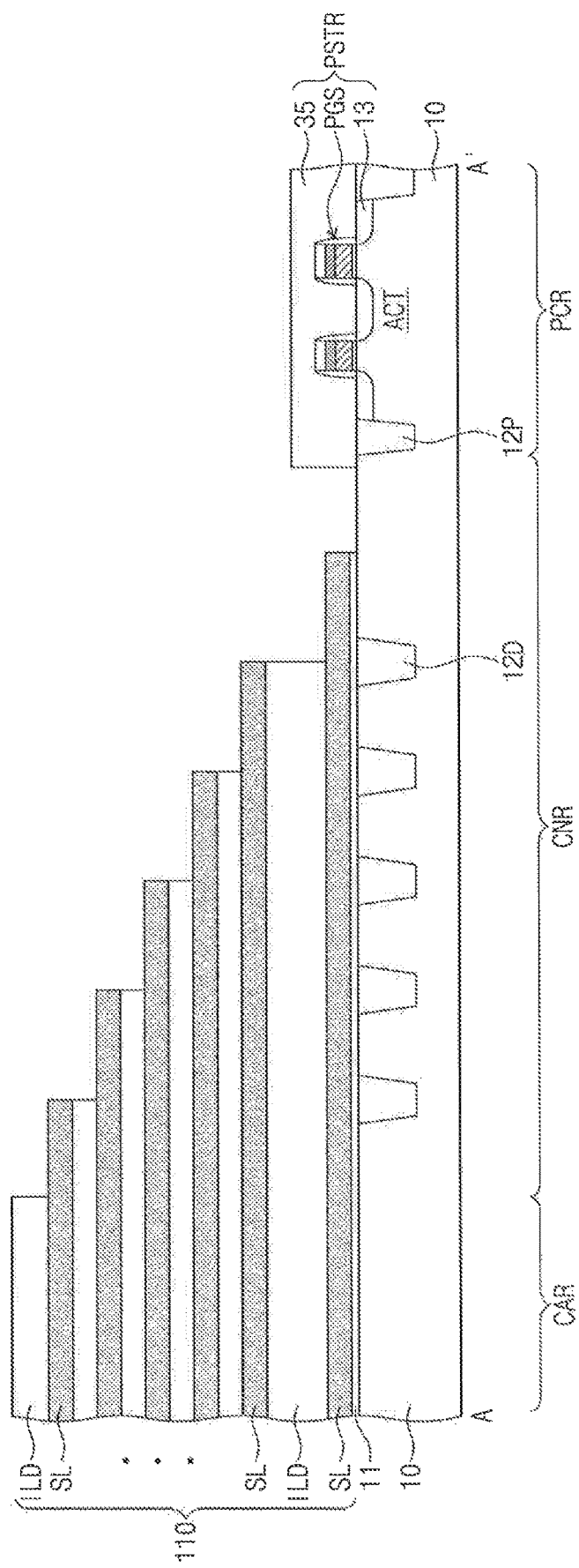

Referring to FIG. 14, a plurality of the dummy insulating patterns 12D may be formed in the connection region CNR of the substrate 10, and the device isolation layer 12P may be formed in the peripheral circuit region PCR of the substrate 10 to define the peripheral active region ACT.

The formation of the dummy insulating patterns 12D and the device isolation layer 12P may include forming trenches in the connection region CNR and the peripheral circuit region PCR of the substrate 10 and filling the trenches with an insulating material. The dummy insulating patterns 12D may have a line shape, a bar shape, or an island shape, as previously described with reference to FIGS. 3A, 3B, 9A, and 9B. The dummy insulating patterns 12D may have substantially the same height as that of the device isolation layer 12P.

Thereafter, the peripheral circuit structure PSTR may be formed on the peripheral circuit region PCR of the substrate 10. In detail, the peripheral gate stack PGS may be formed on the peripheral circuit region PCR of the substrate 10 to cross the active region ACT. The formation of the peripheral gate stack PGS may include sequentially stacking a peripheral gate insulating layer 21, a doped poly-silicon layer 23, a gate metal layer 25, and a hard mask layer 27 on the substrate 10 and patterning these layers. Spacers may be formed to cover both side surfaces of the peripheral gate stack PGS, and the source/drain impurity regions 13 may be formed by doping portions of the active region ACT, which are located at both sides of the peripheral gate stack PGS, with first impurities (e.g., boron (B) or phosphorus (P)).

After the formation of the peripheral logic circuits, a peripheral insulating layer may be formed on the substrate 10 to cover the peripheral gate stack PGS. Thereafter, the peripheral insulating layer may be patterned to form a peripheral insulating pattern 35 exposing the cell array region CAR and the connection region CNR of the substrate 10. The peripheral insulating pattern 35 may include a plurality of insulating layers or may include at least one of a silicon oxide layer, a silicon nitride layer, a silicon oxynitride layer, or low-k dielectric layers.

Thereafter, referring to FIG. 14, a mold structure 110 may be formed on the cell allay region CAR and the connection region CNR of the substrate 10. The mold structure 110 may include sacrificial layers SL and insulating layers ILD, which are alternatingly stacked on the substrate 10.

In the mold structure 110, the sacrificial layers SL may be formed of or include a material, which can be etched with a high etch selectivity with respect to the insulating layers ILD. As an example, the sacrificial layers SL may be formed of an insulating material different from the insulating layers ILD. For example, the sacrificial layers SL may be formed of a silicon nitride layer, and the insulating layers ILD may be formed of a silicon oxide layer. The sacrificial layers SL may have substantially the same thickness, and at least one of the insulating layers ILD may have a thickness different from the others.

For example, the formation of the mold structure 110 may include forming a layered structure, in which the sacrificial and insulating layers SL and ILD are alternately stacked on the substrate 10, and performing a trimming process on the layered structure. Here, the trimming process may include steps of forming a mask pattern (not shown) covering the layered structure on the cell array region CAR and the connection region CNR, etching the layered structure using the mask pattern as an etch mask, etching the mask pattern to reduce a planar area of the mask pattern, and removing the mask pattern, and here, the steps of etching the layered structure and the mask pattern may be repeated several times, before the step of removing the mask pattern.

As a result of the trimming process, the mold structure 110 may have a staircase structure, whose height decreases in a stepwise manner in a direction from the connection region CNR toward the peripheral circuit region PCR. The mold structure 110 may have a vertical height larger than that of the peripheral circuit structure PSTR. As an example, the vertical height of the mold structure 110 may be equal to or larger than about 2 times the height of the peripheral circuit structure PSTR.

Figure 15:
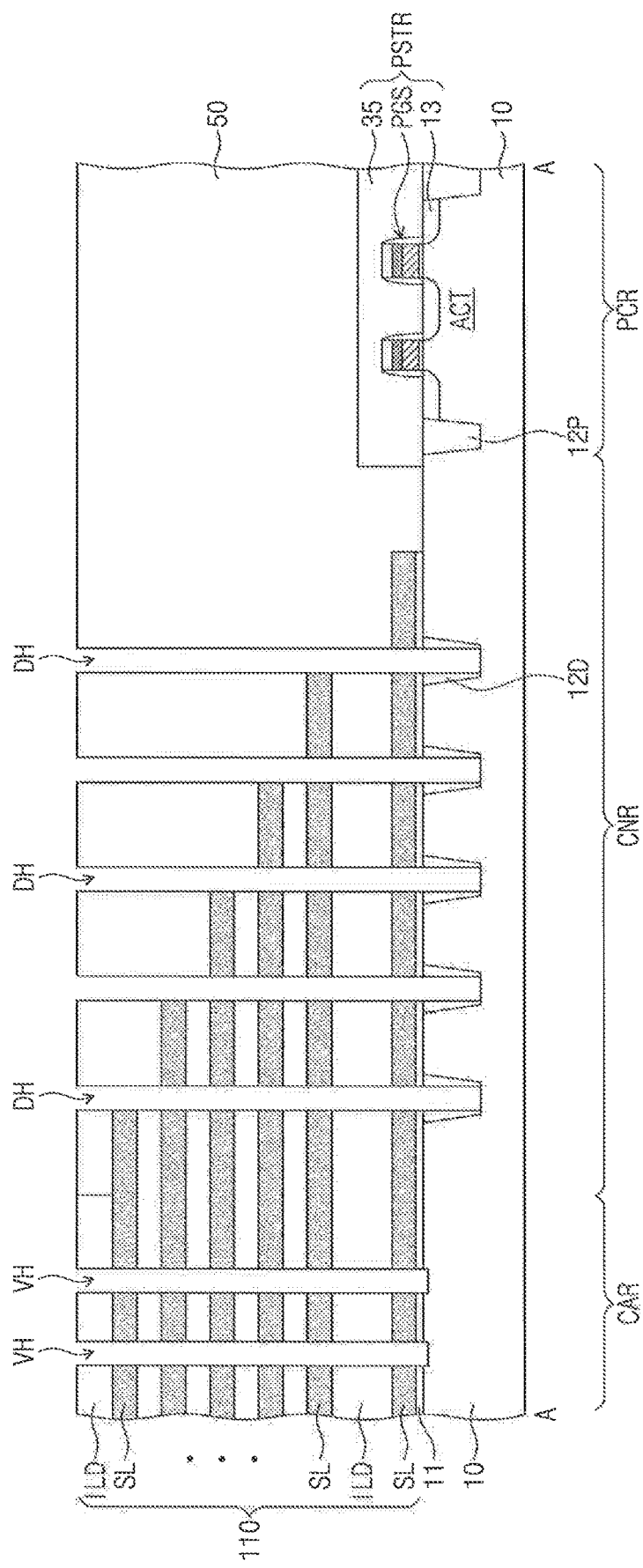

Referring to FIG. 15, after the formation of the mold structure 110, the planarized insulating layer 50 may be formed on the substrate 10. The planarized insulating layer 50 may be formed to cover the mold structure 110 and also the peripheral circuit structure PSTR, and may have substantially a flat (planar) top surface. The planarized insulating layer 50 may be formed of or include an insulating material having an etch selectivity with respect to the sacrificial layers SL.

After the formation of the planarized insulating layer 50, first vertical holes VH may be formed to penetrate the mold structure 110 on the cell array region CAR, and second vertical holes DH may be formed to penetrate the planarized insulating layer 50, the mold structure 110, and the dummy insulating patterns 12D on the connection region CNR.

The formation of the first and second vertical holes VH and DE1 may include forming a mask pattern (not shown) on the mold structure 110 and the planarized insulating layer 50 and anisotropically etching the mold structure 110 and the planarized insulating layer 50 using the mask pattern (not shown) as an etch mask.

The first vertical holes VH may be arranged in a specific direction or in a zigzag shape, when viewed in a plan view. The second vertical holes DH may be arranged in a specific direction, when viewed in a plan view, and may be formed to penetrate end portions of the sacrificial layers SL on the connection region CNR. Since the second vertical holes DH are formed on the connection region CNR, the number of the sacrificial layers SL intersected with each of the second vertical holes DH may decrease with decreasing distance from the peripheral circuit region PCR. In some embodiments of the inventive concept, the first and second vertical holes VH and DH may be formed to have a lower width that is smaller than an upper width thereof.

The anisotropic etching process for forming the first vertical holes VH may be performed in an over-etch manner, and in this case, the top surface of the substrate 10 exposed by the first vertical holes VH may be recessed by a specific depth.

In some embodiments of the inventive concept, the substrate 10 and the dummy insulating patterns 12D may have etch rates different from each other in the anisotropic etching process for forming the first and second vertical holes VH and DH, and thus, the bottom surfaces of the second vertical holes DH may be positioned at a level lower than those of the first vertical holes VH. For example, during the anisotropic etching process, the first vertical holes VH may be formed to partially recess the top surface of the substrate 10, but the second vertical holes DH may be formed to expose the dummy insulating patterns 12D below the dummy insulating patterns 12D. In other words, when the first vertical holes VH are formed to expose the substrate 10, the second vertical holes DH may be thrilled to penetrate the dummy insulating patterns 12D and expose the substrate 10 below the dummy insulating patterns 12D.

Figure 16:
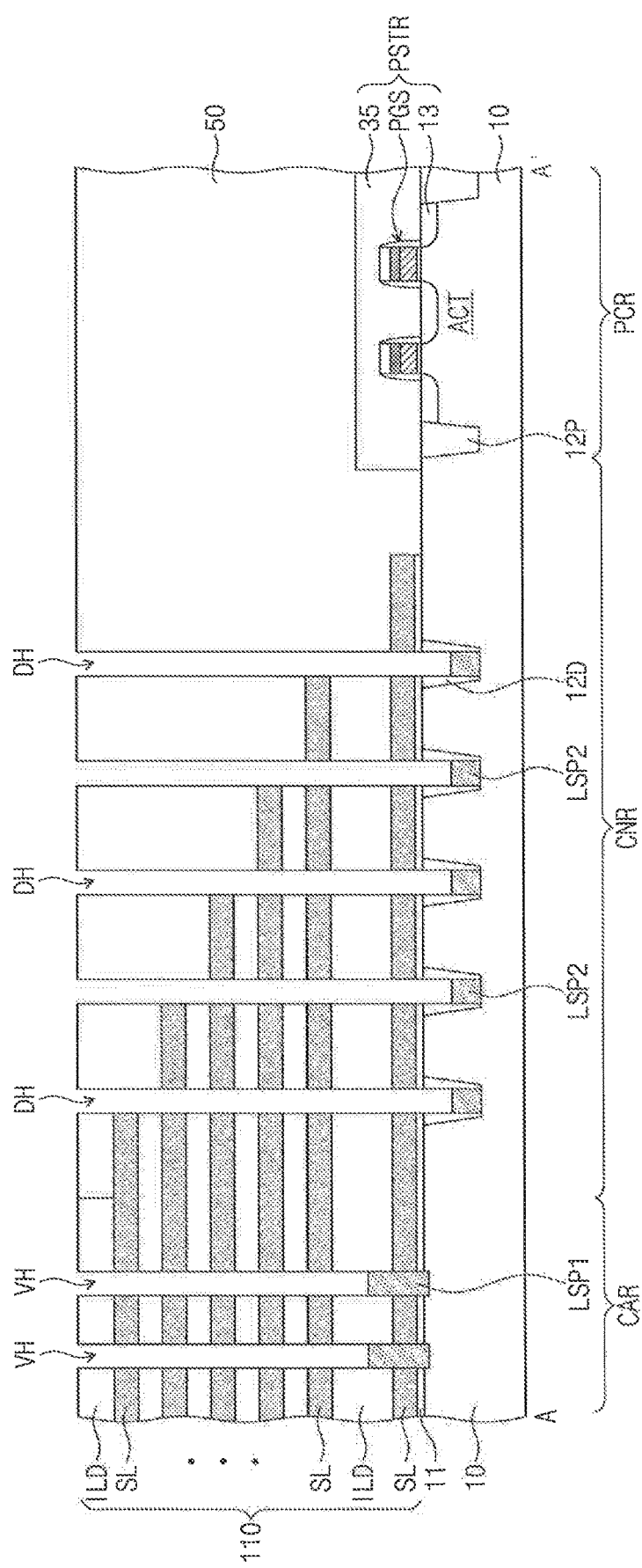

Referring to FIG. 16, the first and second lower semiconductor patterns LSP1 and LSP2 may be formed to fill lower regions of the first and second vertical holes VH and DH.

The first and second lower semiconductor patterns LSP1 and LSP2 may be formed by a selective epitaxial growth (SEG) process in which the substrate 10 exposed by the first and second vertical holes VH and DH is used as a seed layer. The first and second lower semiconductor patterns LSP1 and LSP2 may be pillar-shaped patterns filling the lower regions of the first and second vertical holes VH and DH. In this case, the first and second lower semiconductor patterns LSP1 and LSP2 may have a single-crystalline structure or a poly-crystalline structure having a grain size larger than that formed by a chemical vapor deposition technology. In some embodiments, silicon may be used for the first and second lower semiconductor patterns LSP1 and LSP2, but the inventive concept is not limited thereto. For example, in certain embodiments, at least one of carbon nano structures, organic semiconductor materials, and compound semiconductor materials may be used for the first and second lower semiconductor patterns LSP1 and LSP2. Alternatively, the first and second lower semiconductor patterns LSP1 and LSP2 may be formed of a poly-crystalline semiconductor material (e.g., poly-silicon). Furthermore, the first and second lower semiconductor patterns LSP1 and LSP2 may be formed to have the same conductivity type as that of the substrate 10. The first and second lower semiconductor patterns LSP1 and LSP2 may be doped in situ with impurities during the SEG process.

In some embodiments, during the SEG process, an undesired gas (e.g., hydrogen, carbon, or nitrogen) may be produced from the planarized insulating layer 50 and then may be outgassed through the second vertical holes. The undesired gas may suppress growth of the second lower semiconductor patterns LSP2 below the second vertical holes. Accordingly, the second lower semiconductor patterns LSP2 may have heights smaller than those of the first lower semiconductor patterns LSPP. The top surfaces of the first lower semiconductor patterns LSP1 may be positioned at a level higher than that of the lowermost one of the sacrificial layers SL, and the top surfaces of the second lower semiconductor patterns LSP2 may be positioned below the bottom surface of the lowermost one of the sacrificial layers SL (i.e., the top surface of the substrate 10). In addition, the side surface of the first lower semiconductor pattern LSP1 may be in direct contact with the lowermost one of the sacrificial layers SL, and the side surface of the second lower semiconductor pattern LSP2 may be in direct contact with the dummy insulating pattern 12D.

Furthermore, since a thickness of the planarized insulating layer 50 on the connection region CNR increases with decreasing distance from the peripheral circuit region PCR, an outgassing amount of the undesired gas through the second vertical holes during the SEG process may increase with decreasing distance from the peripheral circuit region PCR. Accordingly, the shorter the distance from the peripheral circuit region PCR, the smaller the height of the second lower semiconductor pattern LSP2.

Figure 17:
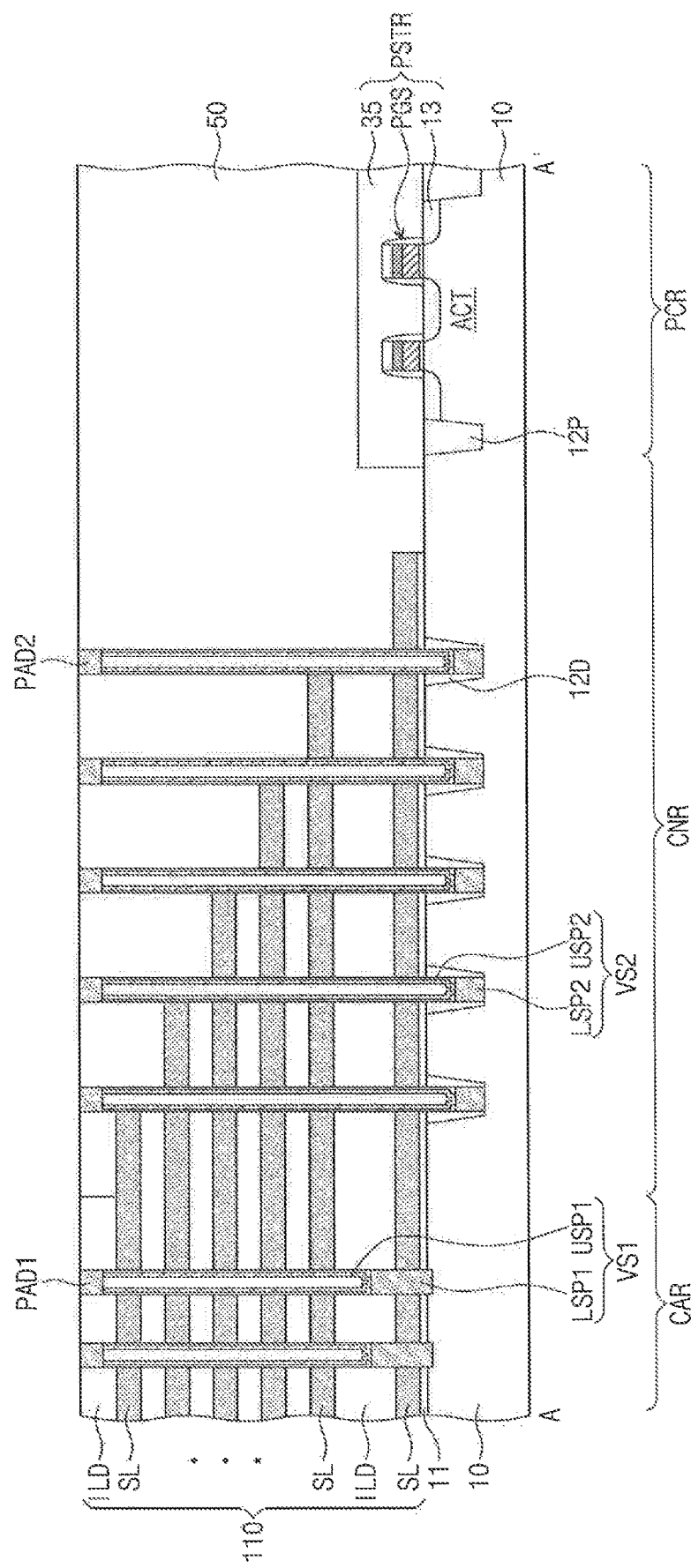

Referring to FIG. 17 in conjunction with FIGS. 5A and 5B, the first and second vertical insulating patterns VP1 and VP2 may be formed in the first and second vertical holes VH and DH, prior to the formation of the first and second upper semiconductor patterns USP1 and USP2. The formation of the first and second vertical insulating patterns VP1 and VP2 may include uniformly forming a vertical insulating layer and a first semiconductor layer on inner surfaces of the first and second vertical holes VH and DH with the first and second lower semiconductor patterns LSP1 and LSP2 (e.g., using a deposition method) and performing an anisotropic etching process on the vertical insulating layer and the first semiconductor layer to expose portions of the first and second lower semiconductor patterns LSP1 and LSP2. Each of the first and second vertical insulating patterns VP1 and VP2 may be composed of a single layer or a plurality of layers and may be used as a part of a data storing layer. For example, the first and second vertical insulating patterns VP1 and VP2 may be formed of or include at least one of a silicon oxide layer, a silicon nitride layer, or a high-k dielectric layer.

After the formation of the first and second vertical insulating patterns VP1 and VP2, the first and second upper semiconductor patterns USP1 and USP2 may be formed in the first and second vertical holes VH and DH. The first and second upper semiconductor patterns USP1 and USP2 may be connected to the first and second lower semiconductor patterns LSP1 and LSP2, respectively. Thus, the first vertical structures VS1, each of which includes the first lower semiconductor pattern LSP1 and the first upper semiconductor pattern USP1, may be formed in the first vertical holes, respectively, and the second vertical structures VS2, each of which includes the second lower semiconductor pattern LSP2 and the second upper semiconductor pattern USP2, may be formed in the second vertical holes DH, respectively.

The first and second upper semiconductor patterns USP1 and USP2 may be formed by depositing a semiconductor layer to a uniform thickness on the first and second vertical holes VH and DH provided with the first and second vertical insulating patterns VP1 and VP2. In some embodiments of the inventive concept, the semiconductor layer may be formed to have a conformal thickness but may be too thin to completely fill the first and second vertical holes and DH. Accordingly, the first and second upper semiconductor patterns USP1 and USP2 may define empty or gap regions, which are located in the first and second vertical holes VH and DH and are filled with an insulating gapfill layer or a gaseous material.

Furthermore, the bit-line conductive pad PAD1 and the dummy conductive pad PAD2 may be formed in or on top portions of the first and second upper semiconductor patterns USP1 and USP2. The bit-line and dummy conductive pads PAD1 and PAD2 may be impurity-doped regions or may be formed of a conductive material.

Figure 18:
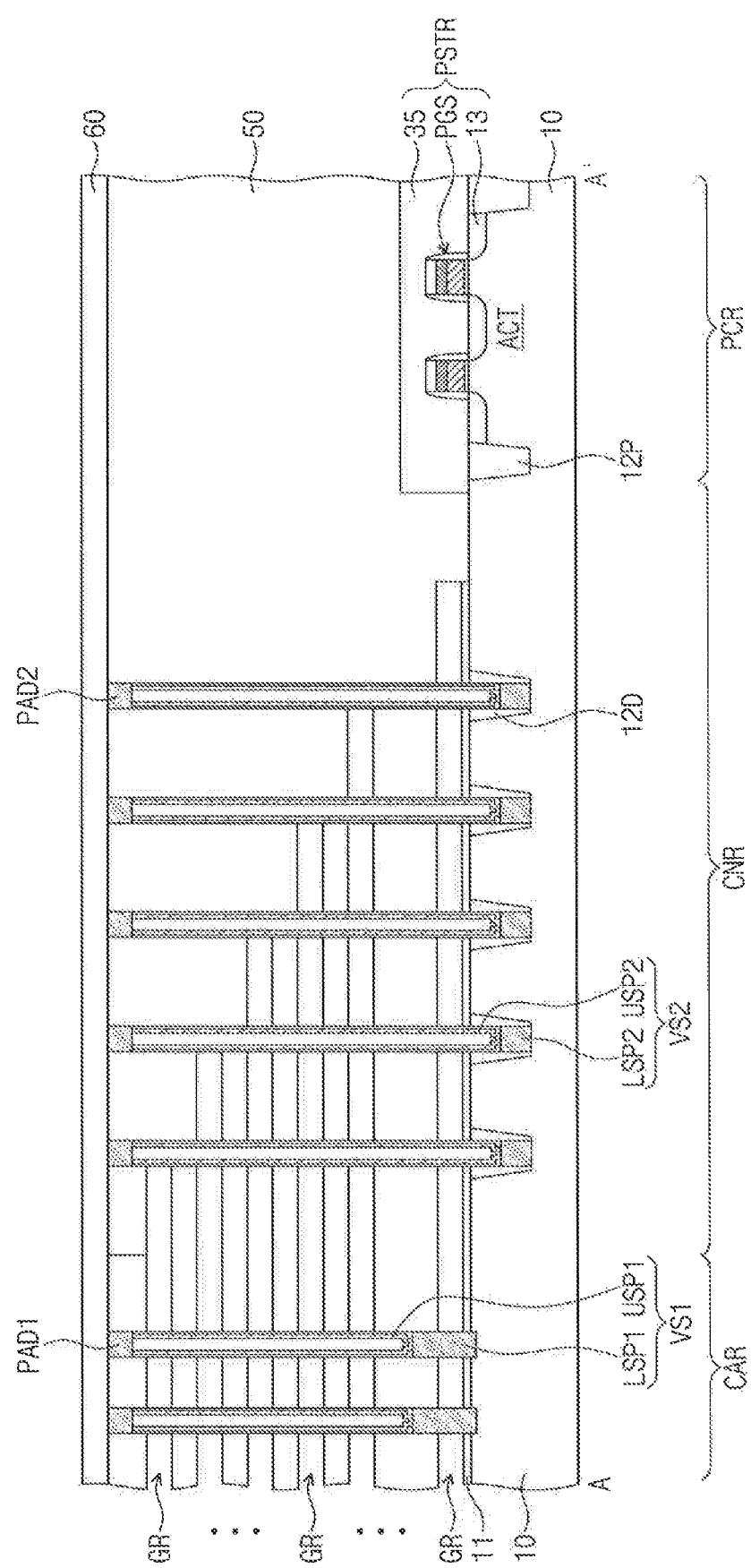

Referring to FIG. 18, the first interlayered insulating layer 60 may be formed on the planarized insulating layers 50 to cover the top surfaces of the first and second vertical structures VS1 and VS2.

After the formation of the first interlayered insulating layer 60, a replacement process may be performed to replace the sacrificial layers SL with the electrodes EL. In detail, the replacement process may include forming trenches (not shown) on the cell array region CAR and the connection region CNR to penetrate the first interlayered insulating layer 60, the planarized insulating layer 50, and the mold structure 110 and thereby to expose the substrate 10, removing the sacrificial layers SL exposed through the trenches to form gate regions GR between the insulating layers, and then, forming the electrodes EL in the gate regions GR, respectively.

Here, the trenches may be formed to extend in the first direction D1 and to be spaced apart from each other in the second direction D2 crossing the first direction D1. In some embodiments, the trenches may have different lengths, and in this case, a portion of the mold structure 110 on the connection region CNR may be formed in a "H" shape substantially, when viewed in a plan view. The trenches may be formed to be spaced apart from the first and second vertical structures VS1 and VS2 and to expose side surfaces of the sacrificial and insulating layers SL and ILD.

The formation of the gate regions GR may include isotropically etching the sacrificial layers SL using an etch recipe, which is selected to have an etch selectivity with respect to the planarized insulating layer 50, the insulating layers ILD, the first and second vertical structures VS1 and VS2, and the substrate 10.

In some embodiments, the lowermost ones of the gate regions GR may be formed to expose the side surfaces of the first lower semiconductor patterns LSP1 on the cell array region CAR and to expose the side surfaces of the second vertical insulating patterns VP2 on the connection region CNR. During the process of removing the sacrificial layers SL of the mold structure 110, the second lower semiconductor patterns LSP2 may not be exposed to the gate regions GR.

Figure 19:
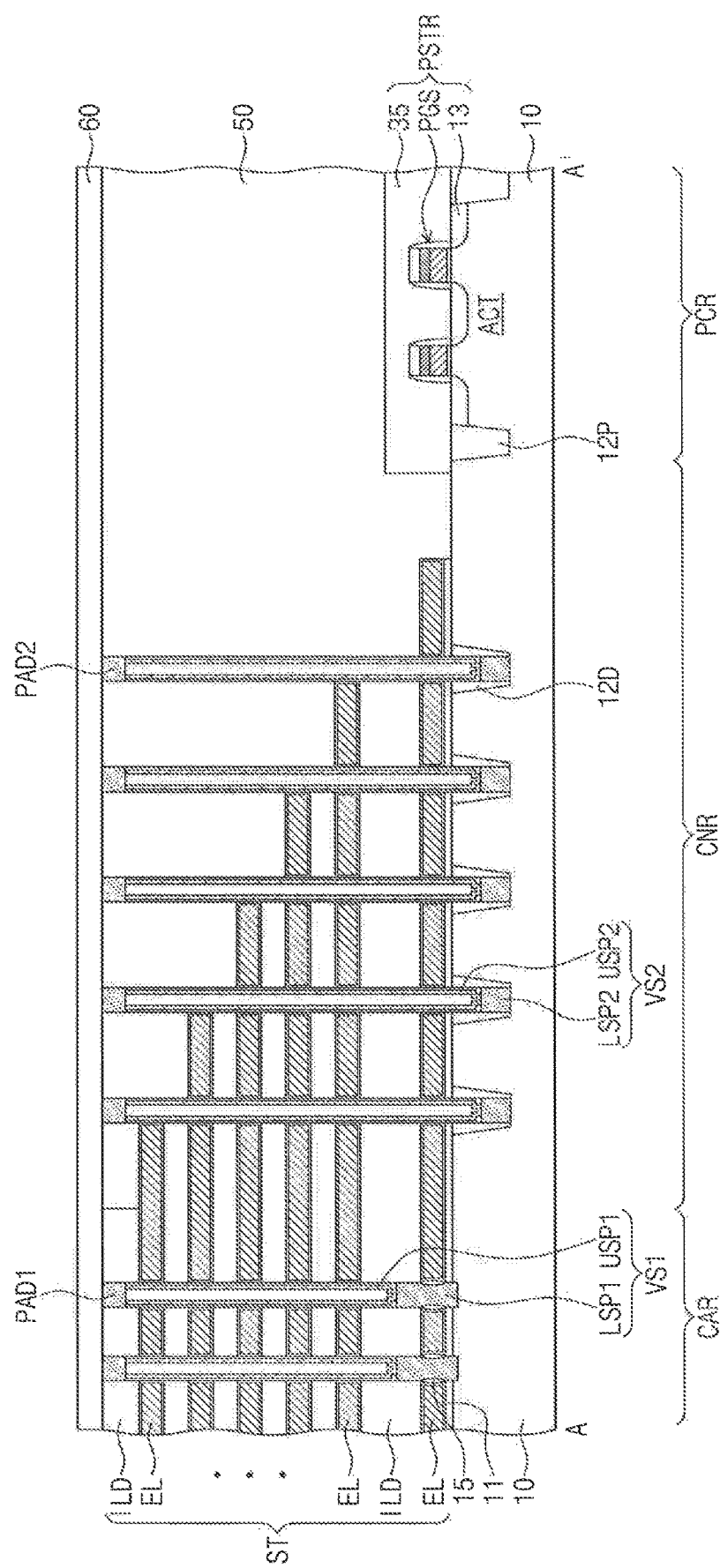

Next, referring to FIG. 19, the gate insulating layer 15 may be formed on the side surfaces of the first lower semiconductor patterns LSP1 exposed by the lowermost ones of the gate regions GR. The gate insulating layer 15 may be formed by a thermal treatment process, in which an ambient gas containing oxygen atoms is used. Accordingly, the side surface of the first lower semiconductor pattern LSP1 exposed by the gate region GR may be thermally oxidized to form the gate insulating layer 15.

Thereafter, the electrodes EL may be formed in the gate regions GR, respectively, and the formation of the electrodes EL may include sequentially forming a horizontal insulating layer, a barrier metal layer, and a metal layer to cover the mold structure 110 with the gate regions GR, and anisotropically etching the barrier metal layer and the metal layer in the trenches. Here, the horizontal insulating layer may include a silicon oxide layer and/or a high-k dielectric layer and may be used as a part of the data storing layer. In some embodiments, the barrier metal layer may be formed of or include at least one of metal nitrides (e.g., TiN, TaN, or WN). The metal layer may be formed of or include at least one of metal materials (e.g., W, Al, Ti, Ta, Co, or Cu).

As a result of the replacement process, the electrode structure ST including the electrodes EL may be formed on the substrate 10. In some embodiments of the inventive concept, as described with reference to FIGS. 4A, 4B, and 4C, each of the electrode structure ST may include the electrodes EL and the insulating layers ILD, which are vertically and alternately stacked on the substrate 10.

Furthermore, the common source regions CSR may be formed in the substrate 10 exposed by the trenches. The common source regions CSR may extend parallel to each other and in the first direction D1 and may be spaced apart from each other in the second direction D2. The common source regions CSR may be formed by doping the substrate 10 with impurities that are of a different type from that of the substrate 10. The common source regions CSR may contain, for example, n-type impurities (e.g., arsenic (As) or phosphorus (P)).

Next, referring to FIGS. 4A, 4B, and 4C, after the formation of the electrode structure ST, the insulating spacers SP may be formed to cover the side surfaces of the electrode structure ST. The formation of the insulating spacers SP may include conformally depositing a spacer layer on the substrate 10 provided with the electrode structures ST and then performing an etch-back process on the spacer layer to expose the common source region CSR. Here, the spacer layer may be formed of or include an insulating material (e.g., silicon oxide, silicon nitride, silicon oxynitride, or low-k dielectric materials).

The common source plugs CSP may be formed in the trenches, respectively, in which the insulating spacers SP are provided. In some embodiments, the common source plugs CSP may be provided between a horizontally-adjacent pair of the electrodes EL, and the insulating spacers SP may be interposed between the electrodes EL and the common source plug CSP. In other words, the side surfaces of the common source plugs CSP may be covered with the insulating spacers SP. In addition, the common source plugs CSP may extend parallel to the electrodes EL, and the top surfaces of the common source plugs CSP may be positioned at a level higher than those of the first and second vertical structures VS1 and VS2.

The second interlayered insulating layer 70 may be formed on the first interlayered insulating layer 60 to cover the top surfaces of the common source plugs CSP. Next, the bit line contact plugs BPLG may be formed to penetrate the first and second interlayered insulating layers 60 and 70, and in some embodiments, the bit line contact plugs BPLG may be coupled to the first vertical structures VS1, respectively. Furthermore, contact plugs CPLG, PUPLG and PPLG may be formed on the connection region CNR and the peripheral circuit region PCR to electrically connect the electrodes EL to the peripheral logic circuits. The bit lines BL may be formed on the second interlayered insulating layer 70 to extend in the second direction D2, and in some embodiments, the bit lines BL may be coupled to the bit line contact plugs BPLG.

According to some embodiments of the inventive concept, in vertical structures on a connection region, a top surface of an epitaxial pattern is positioned (at a level) lower than the lowermost one of electrodes, and this positioning may increase a uniformity of distance between an upper semiconductor pattern of a dummy vertical structure and vertically-stacked electrodes. Furthermore, this construction may result in enhancing a breakdown voltage property of ground selection transistors provided on the connection region.

In addition, according to some embodiments of the inventive concept, epitaxial patterns that would be abnormally grown on side surfaces of vertical holes formed on the connection region may be reduced or prevented, when the vertical structures including the epitaxial patterns are formed on the cell array region and the connection region.

While example embodiments of the inventive concept have been particularly shown and described, it will be understood by one of ordinary skill in the art that variations in form and detail may be made therein without departing from the spirit and scope of the attached claims.

What is claimed is:

1. A three-dimensional semiconductor memory device, comprising:
    a substrate including a cell array region and a connection region;
    an electrode structure including a plurality of electrodes vertically stacked on the substrate;
    a plurality of first vertical channels that penetrate the electrode structure on the cell array region;
    a plurality of second vertical channels that penetrate the electrode structure on the connection region;
    a dummy insulating pattern provided in the connection region of the substrate,
    wherein each of the first vertical channels and the second vertical channels includes a lower channel pattern connected to the substrate and an upper channel pattern connected to the lower channel pattern,
    wherein a lowermost electrode of the plurality of electrodes surrounds the lower channel patterns of the first vertical channels and the upper channel patterns of the second vertical channels,
    wherein top-most surfaces of the lower channel patterns of the second vertical channels are positioned at a lower level than a top surface of the substrate,
    wherein the dummy insulating pattern is spaced apart from the plurality of first vertical channels, and
    wherein the dummy insulating pattern contacts sidewalls of the lower channel patterns of the second vertical channels.

2. The device of claim 1, wherein top surfaces of the lower channel patterns of the first vertical channels are positioned higher than a top surface of the lowermost electrode, and top surfaces of the lower channel patterns of the second vertical channels are positioned lower than a bottom surface of the lowermost electrode.

3. The device of claim 1, wherein each of the lower channel patterns of the first and second vertical channels comprises a pillar-shaped epitaxial pattern.

4. The device of claim 1, wherein the plurality of second vertical channels are arranged to penetrate the dummy insulating pattern and directly contact the substrate.

5. The device of claim 4, wherein a height of the dummy insulating pattern is greater than a height of each of the lower channel patterns of the second vertical channels.

6. The device of claim 1, wherein bottom surfaces of the second vertical channels are positioned lower than bottom surfaces of the first vertical channels.

7. The device of claim 1, wherein the lower channel patterns of the first vertical channels have a first height, and the lower channel patterns of the second vertical channels have a second height smaller than the first height of the lower channel patterns of the first vertical channels.

8. The device of claim 1, farther comprising:
    a plurality of first vertical insulating patterns provided between the upper channel patterns of the first vertical channels and the electrode structure, the first vertical insulating patterns having bottom surfaces being positioned higher than the top surface of the lowermost one of the electrodes; and
    a plurality of second vertical insulating patterns provided between the upper channel patterns of the second vertical channels and the electrode structure, the second vertical insulating patterns having bottom surfaces positioned lower than the bottom surface of the lowermost one of the electrodes.

9. The device of claim 1, further comprising a gate insulating layer interposed between the lower channel patterns of the plurality of first vertical channels and the lowermost electrode.

10. The device of claim 1, wherein a distance between a side surface of the lowermost electrode and the plurality of first vertical channels is different from a distance between a side surface of the lowermost electrode and the plurality of the second vertical channels.

11. The device of claim 1, wherein the lower channel patterns of the first and second vertical channels comprise a semiconductor material having a crystal structure different from that of the upper channel patterns of the first and second vertical channels.

12. A three-dimensional semiconductor memory device, comprising:
    a substrate including a cell array region and a connection region;
    an electrode structure including a plurality of electrodes stacked in a first direction perpendicular to a top surface of the substrate, the electrode structure having a staircase-shape on the connection region;
    a first vertical channel that penetrates the electrode structure on the cell array region, the first vertical channel including a first lower channel pattern in direct contact with the substrate and a first upper channel pattern connected to the first lower channel pattern; and
    a second vertical channel that penetrates the electrode structure on the connection region, the second vertical channel including a second lower channel pattern in direct contact with the substrate and a second upper channel pattern connected to the second low pattern,
    wherein a lowermost electrode of the plurality of electrodes surrounds the first lower channel pattern and the second upper channel pattern,
    wherein a sidewall of the second lower channel pattern is spaced apart from the substrate,
    wherein a top surface of the second lower channel pattern is positioned at a lower level than a bottom surface of the lowermost electrode, and
    wherein each of the first lower channel pattern and the second lower channel pattern comprises a pillar-shaped epitaxial pattern directly contacting the substrate.

13. The device of claim 12, herein a top surface of the first lower pattern is positioned higher than a top surface of the lowermost electrode, and
    a top surface of the second lower channel pattern is positioned lower than a bottom surface of the lowermost electrode.

14. The device of claim 12, wherein a top surface of the second lower channel pattern is positioned at a lower level than a top surface of the substrate.

15. The device of claim 12, further comprising:
a first vertical insulating pattern disposed on the first lower channel pattern and, surrounding a sidewall of the first upper channel pattern; and
a second vertical insulating pattern disposed on the second lower channel pattern and surrounding a sidewall of the second upper channel pattern.

16. The device of claim 15, wherein a bottom surface of the second vertical insulating pattern is positioned at a lower level than a bottom surface of the lowermost electrode.

17. The device of claim 12, wherein a distance between a side surface of the lowermost electrode and the first vertical channel is different from a distance between a side surface of the lowermost electrode and the second vertical channel.

18. The device of claim 12, wherein the first lower channel pattern has a first height, and the second lower channel pattern has a second height smaller than the first height.

19. The device of claim 12, further comprising a dummy insulating pattern provided in the connection region of the substrate,
wherein the second vertical channel penetrates the dummy insulating pattern and is in contact with the substrate, and
wherein a height of the dummy insulating pattern is greater than a height of the second lower channel pattern of the second vertical channel.

20. A three-dimensional semiconductor memory device, comprising:
a substrate including a cell array region and a connection region;
an electrode structure including a plurality of electrodes vertically stacked on the substrate;
a plurality of first vertical channels that penetrate the electrode structure on the cell array region; and
a plurality of second vertical channels that penetrate the electrode structure on the connection region,
wherein each of the plurality of first vertical channels and each of the plurality of second vertical channels includes a lower channel pattern in direct contact with the substrate and an upper channel pattern connected to the lower channel pattern and a sidewall of the second lower channel pattern is spaced apart from the substrate,
wherein a lowermost electrode of the plurality of electrodes surrounds the lower channel pattern of each of the plurality of first vertical channels and the upper channel pattern of each of the plurality of second vertical channels,
wherein top surfaces of the lower channel pattern of each of the plurality of second vertical channels are positioned at a lower level than a bottom surface of the lowermost electrode,
wherein the top surfaces of each of the plurality of lower channel patterns of the second vertical channels are positioned at a lower level than a top surface of the substrate, and
wherein each of the lower channel patterns of the first and second vertical channels comprises a pillar-shaped epitaxial pattern directly contacting the substrate.

* * * * *